United States Patent
Zenou et al.

(10) Patent No.: US 11,548,212 B2
(45) Date of Patent: Jan. 10, 2023

(54) LASER-BASED DROPLET ARRAY JETTING OF HIGH VISCOUS MATERIALS

(71) Applicant: IO Tech Group Ltd., London (GB)

(72) Inventors: Michael Zenou, Hashmonaim (IL); Ziv Gilan, Kfar-harif (IL)

(73) Assignee: IO Tech Group Ltd., Modiin (IL)

( * ) Notice: Subject to any disclaimer, the term of this patent is extended or adjusted under 35 U.S.C. 154(b) by 13 days.

(21) Appl. No.: 17/305,747

(22) Filed: Jul. 14, 2021

(65) Prior Publication Data

US 2021/0339462 A1 Nov. 4, 2021

Related U.S. Application Data

(63) Continuation of application No. 16/383,891, filed on Apr. 15, 2019, now Pat. No. 11,097,465.

(Continued)

(51) Int. Cl.
*B41J 2/14* (2006.01)
*B05D 3/06* (2006.01)
(Continued)

(52) U.S. Cl.
CPC .............. *B29C 64/112* (2017.08); *B05D 1/02* (2013.01); *B05D 3/06* (2013.01); *B29C 64/205* (2017.08);
(Continued)

(58) Field of Classification Search
CPC ... B29C 64/112; B29C 64/205; B29C 64/268; B29C 64/209; B05D 1/02; B05D 3/06;
(Continued)

(56) References Cited

U.S. PATENT DOCUMENTS

| 7,198,879 B1 | 4/2007 | Tredwell et al. |
| 2004/0032459 A1 | 2/2004 | Te |
| | (Continued) | |

FOREIGN PATENT DOCUMENTS

| JP | 54056847 A | * 5/1979 | .............. B41M 5/41 |
| JP | S5456847 A | 5/1979 | |
| | (Continued) | | |

OTHER PUBLICATIONS

Examination Report dated Oct. 14, 2021, from the European Patent Office, for EP Patent Application No. 19 726 739.6, 9 pgs.

(Continued)

*Primary Examiner* — Yaovi M Ameh
(74) *Attorney, Agent, or Firm* — Ascenda Law Group, PC

(57) ABSTRACT

Laser jetting of droplets of a viscous material, such as an ink, is performed by coating a layer of ink on a mesh-like transport screen, with the ink being retained within spaces of the mesh-like transport screen. The ink-coated mesh-like transport screen is conveyed to a working area and a laser beam is used to heat the ink within the spaces of the mesh-like transport screen, thereby causing ink droplets to be jetted from the spaces of the mesh-like transport screen. Structures are formed on a receiving substrate arranged near the working area by jetting the ink droplets, either in an aggregation or sequentially, across a gap from the mesh-like transport screen to the receiving substrate and displacing the mesh-like transport screen and the laser beam relative to one another at times between the jetting of the droplets, or by directly printing ink droplets onto the receiving substrate.

15 Claims, 19 Drawing Sheets

Related U.S. Application Data

(60) Provisional application No. 62/661,189, filed on Apr. 23, 2018.

(51) Int. Cl.
| | |
|---|---|
| *B29C 64/268* | (2017.01) |
| *B29C 64/112* | (2017.01) |
| *B29C 64/205* | (2017.01) |
| *B41M 5/00* | (2006.01) |
| *B33Y 10/00* | (2015.01) |
| *B05D 1/02* | (2006.01) |

(52) U.S. Cl.
CPC ............ *B29C 64/268* (2017.08); *B33Y 10/00* (2014.12); *B41J 2/14* (2013.01); *B41J 2/14104* (2013.01); *B41M 5/0047* (2013.01)

(58) Field of Classification Search
CPC .. B33Y 10/00; B33Y 30/00; B41J 2/14; B41J 2/14104; B41M 5/0047; H05K 3/125
See application file for complete search history.

(56) References Cited

U.S. PATENT DOCUMENTS

| | | | |
|---|---|---|---|
| 2007/0077511 A1* | 4/2007 | Tredwell | B41M 5/398 430/201 |
| 2015/0037445 A1 | 2/2015 | Murphy et al. | |
| 2015/0122174 A1 | 5/2015 | Jaffrennou et al. | |
| 2018/0015502 A1* | 1/2018 | Zenou | B33Y 30/00 |

FOREIGN PATENT DOCUMENTS

| | | |
|---|---|---|
| JP | S62244650 A | 10/1987 |
| WO | 2009/035854 A1 | 3/2009 |
| WO | 2018/015075 A1 | 1/2018 |
| WO | WO-2018225073 A1 * 12/2018 | ........... B29C 64/112 |

OTHER PUBLICATIONS

International Search Report and Written Opinion dated Jul. 18, 2019, from the ISA/European Patent Office, for International Patent Application No. PCT/IB2019/053086 (filed Apr. 15, 2019), 15 pages.
Written Opinion of the International Preliminary Examining Authority dated Feb. 17, 2020, from the IPEA/European Patent Office, for International Patent Application No. PCT/IB2019/053086 (filed Apr. 15, 2019), 7 pages.
International Preliminary Report on Patentability dated Sep. 24, 2020, from the IPEA/European Patent Office, for International Patent Application No. PCT/IB2019/053086 (filed Apr. 15, 2019), 12 pages.
Notice of Allowance dated May 20, 2021, from U.S. Appl. No. 16/383,891, filed Apr. 15, 2019, 10 pgs.
Amendment filed May 10, 2021, from U.S. Appl. No. 16/383,891, filed Apr. 15, 2019, 9 pgs.
Non-Final Office Action dated Apr. 5, 2021, from U.S. Appl. No. 16/383,891, filed Apr. 15, 2019, 10 pgs.

* cited by examiner

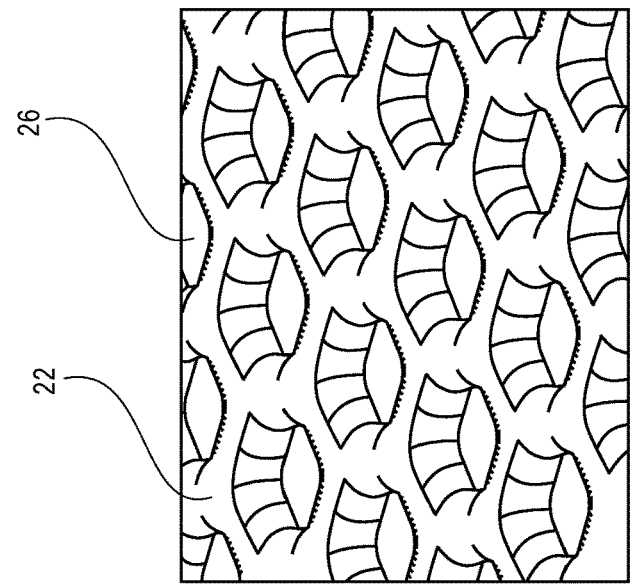
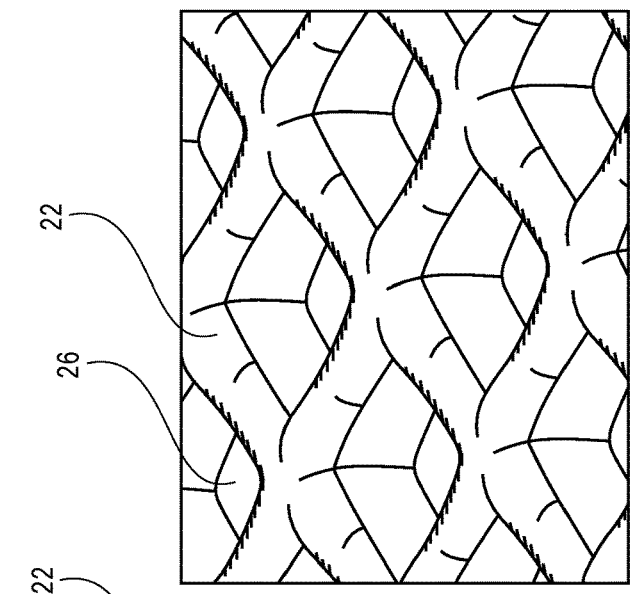
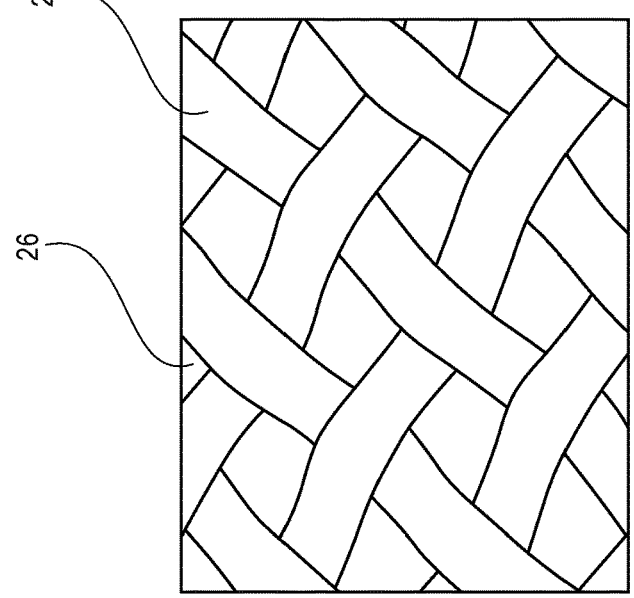
FIG. 3C
FIG. 3B
FIG. 3A

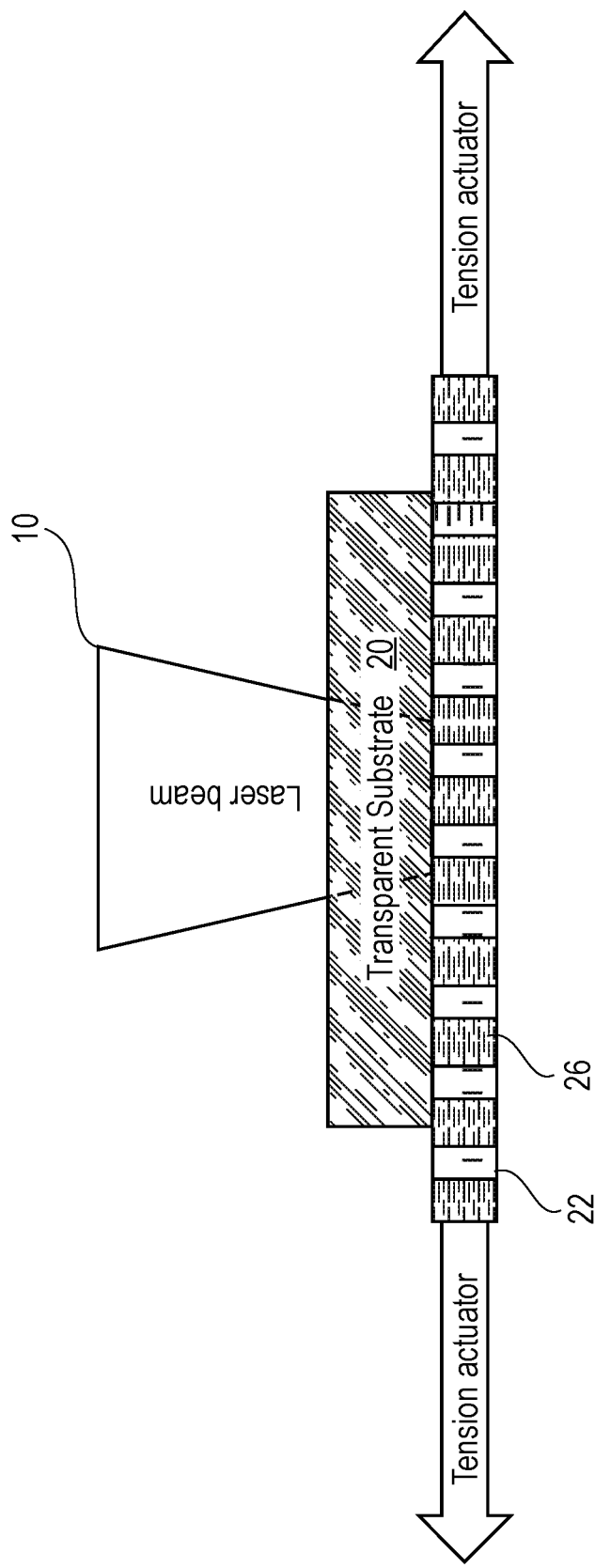

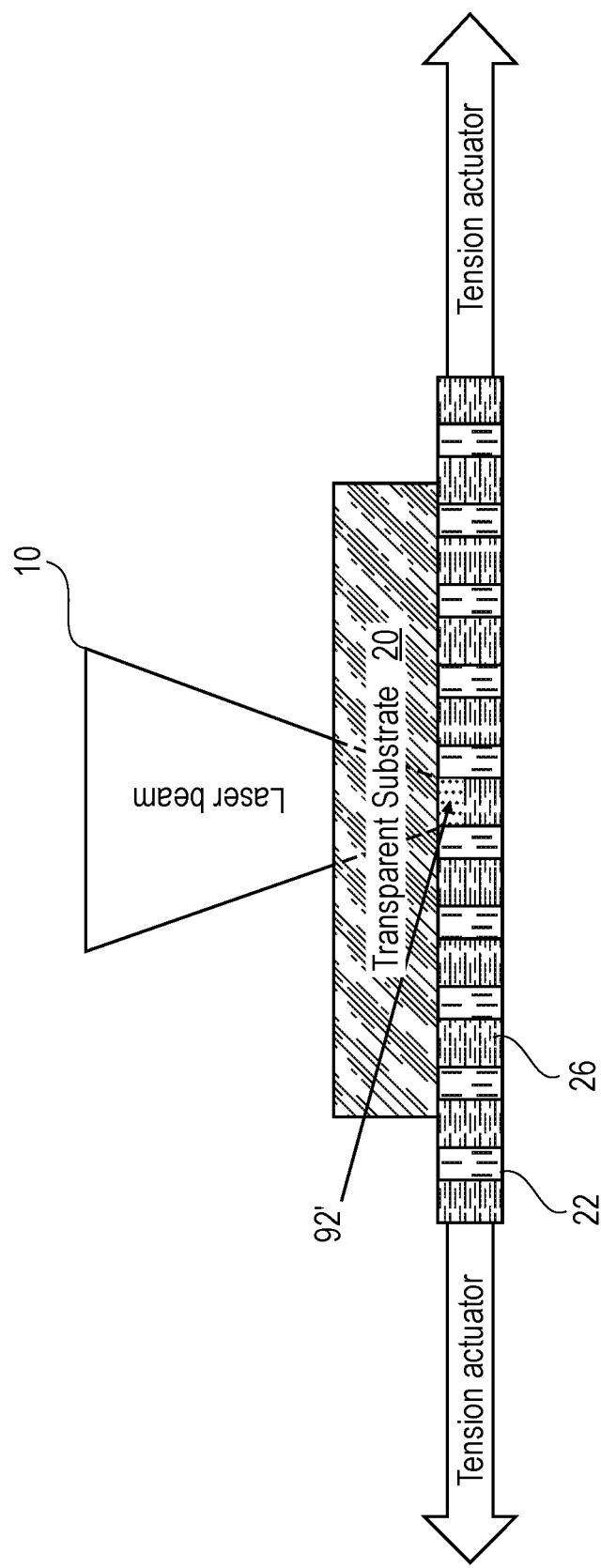

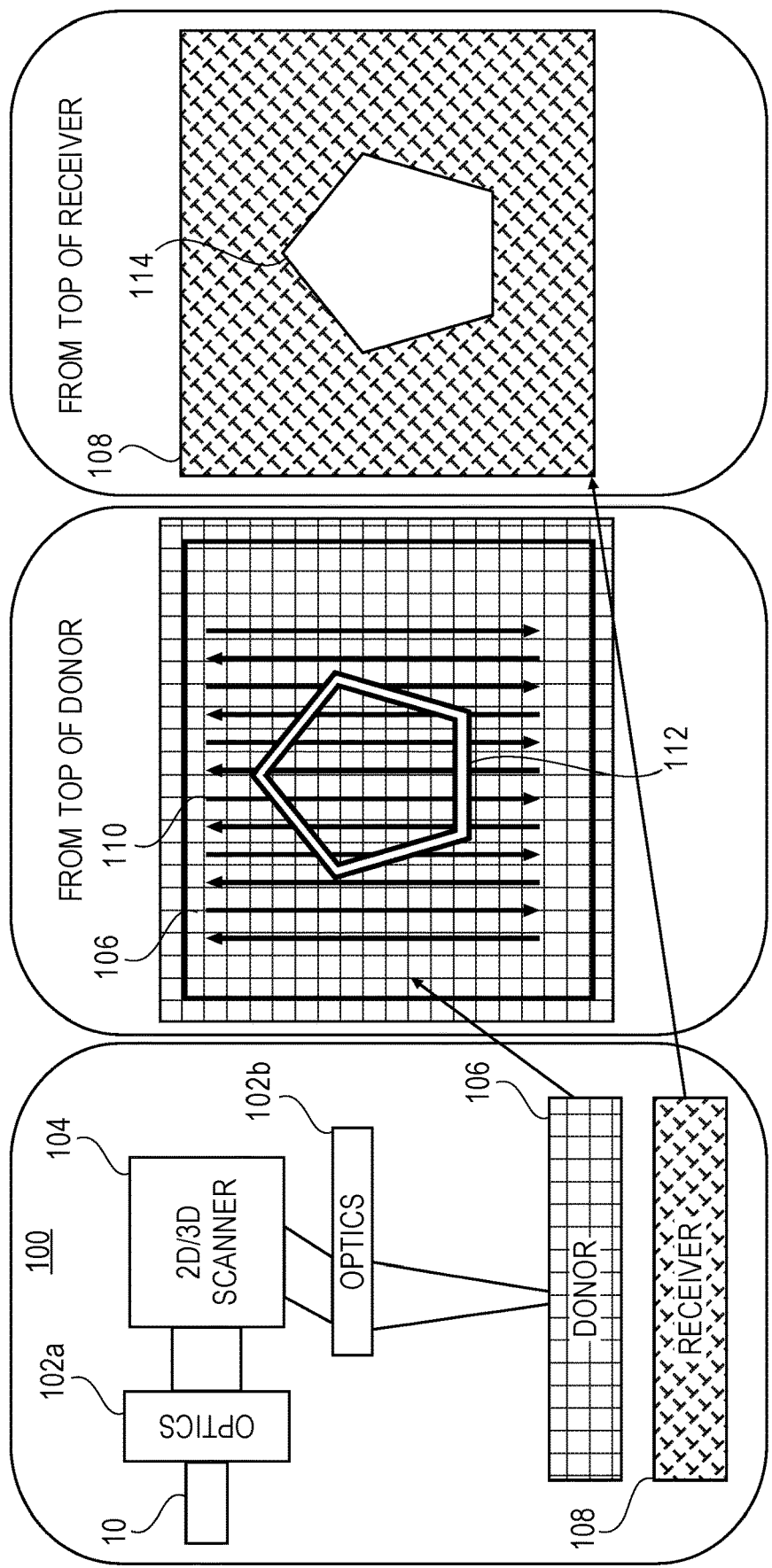

STEP 1: remove the negative
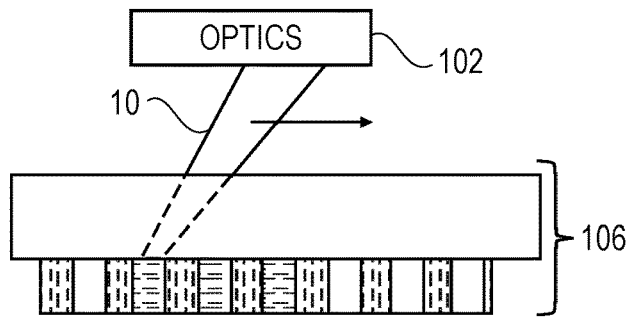
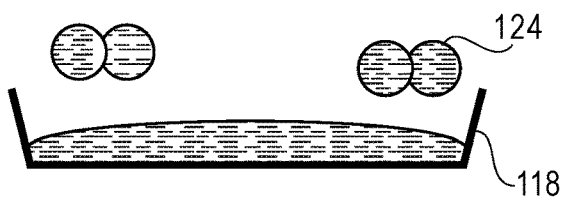
FIG. 12A
STEP 2: Print with laser in contact
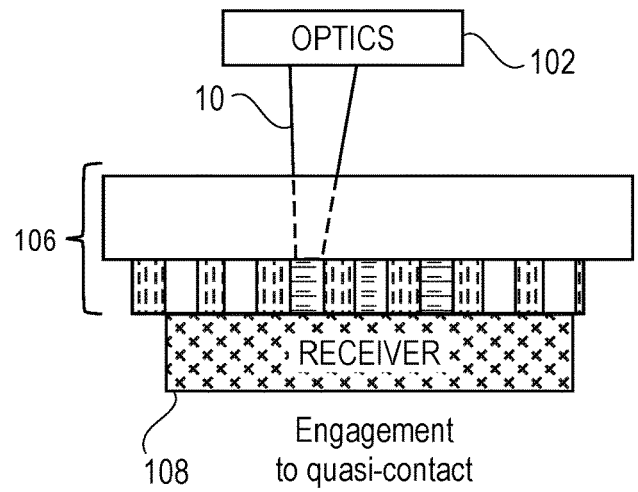
FIG. 12B
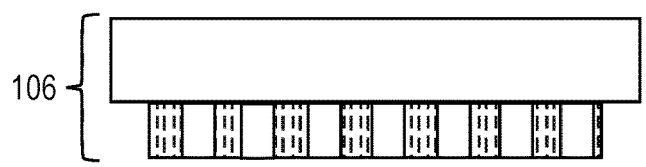
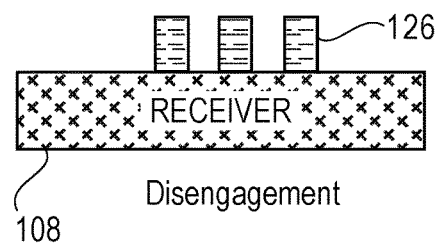
FIG. 12C

LASER-BASED DROPLET ARRAY JETTING OF HIGH VISCOUS MATERIALS

RELATED APPLICATIONS

This application is a Continuation Application of U.S. application Ser. No. 16/383,891, filed on 15 Apr. 2019 (now issued as U.S. Pat. No. 11,097,465), which is a non-provisional patent application of and claims priority to U.S. Provisional Application No. 62/661,189, filed 23 Apr. 2018, both of which are incorporated by reference herein.

FIELD OF THE INVENTION

The present invention relates generally to methods and apparatus used for printing, and, in particular, to such methods and apparatus as employ lasers to create droplets from donor materials, which droplets, when solidified in the aggregate, form two-dimensional ("2D") or three-dimensional ("3D") patterns or structures.

BACKGROUND

A number of different drop-on-demand (DOD) printing techniques have been developed, some of which involve the fabrication of 2D or 3D objects from digital data files under computer control. In general, these techniques rely on piezoelectric and/or thermal actuators to eject small amounts (droplets) of liquid (ink) through a nozzle. While these processes may work well for some inks, they tend not to be well-suited for high viscosity inks which often clog the small nozzles. As a result, when working with viscous inks, the conventional DOD methods tend to require the use of large droplet sizes inasmuch as large bore nozzles are required and the droplets produced are approximately the same size as the nozzles from which they are ejected.

SUMMARY OF THE INVENTION

Embodiments of the present invention provide systems and methods for laser jetting of droplets from donor materials, which droplets, when solidified in the aggregate, form 2D or 3D patterns or structures.

In one embodiment of the invention, laser-based droplet jetting of a viscous material, such as an ink, includes coating a substantially uniform layer of the viscous material on a mesh-like transport screen, with the viscous material being retained within spaces of the mesh-like transport screen, and conveying the viscous material-coated mesh-like transport screen to a working area within which a laser beam is used to heat the viscous material within the spaces of the mesh-like transport screen, thereby causing droplets of the viscous material to be jetted from the spaces of the mesh-like transport screen. By this process, a structure may be formed on a receiving substrate arranged near the working area (a) by jetting the droplets in an aggregation across a gap from the mesh-like transport screen to the receiving substrate, (b) by jetting the droplets sequentially across a gap from the mesh-like transport screen to the receiving substrate and displacing the mesh-like transport screen and the laser beam relative to one another at times between the sequential jetting of the droplets, or (c) by jetting those of the droplets that will not contribute to the structure from the mesh-like transport screen, and subsequently directly printing remaining ones of the droplets onto the receiving substrate while the receiving substrate is in contact with the mesh-like transport screen.

In various instantiations of the invention, the laser beam may be made incident upon the viscous material disposed within the spaces of the mesh-like transport screen, or the laser beam may be made incident upon an area adjacent to the viscous material disposed within the spaces of the mesh-like transport screen. The mesh-like transport screen is preferably under lateral strain while the laser beam is used to heat the viscous material within the spaces of the mesh-like transport screen, for example by being wound from and onto respective reels positioned on opposite sides of the working area.

The substantially uniform layer of viscous material may be coated on the mesh-like transport screen in an application area in which viscous material is injected into the spaces of the mesh-like transport screen from a top portion of the mesh-like transport screen and excess portions of the viscous material are removed from a bottom portion of the mesh-like transport screen. In such cases, the excess portions of the viscous material may be removed from the bottom portion of the mesh-like transport screen by a squeegee arrangement located downstream, from a standpoint of translation of the mesh-like transport screen with respect to a position at which the viscous material is injected into the spaces of the mesh-like transport screen, from the position at which the viscous material is injected into the spaces of the mesh-like transport screen. Alternatively, the substantially uniform layer of viscous material may be coated on the mesh-like transport screen in an application area in which the mesh-like transport screen is transported through a reservoir and excess viscous material is removed by a squeegee arrangement located at an exit of the reservoir.

In various embodiments, a substrate is arranged on a top surface of the mesh-like transport screen after the spaces of the mesh-like transport screen are filled with the viscous material. Prior to so arranging the substrate on the top surface of the mesh-like transport screen, a heat absorbing layer may be coated on a bottom surface of the substrate. More generally, prior to arranging the substrate on the top surface of the mesh-like transport screen, a heat absorbing layer may be introduced between a bottom surface of the substrate and the mesh-like transport screen, for example by coating the heat absorbing layer on a top surface of the mesh-like transport screen after the spaces of the mesh-like transport screen are filled with the viscous material.

A further embodiment of the invention provides for laser-based droplet jetting of a viscous material by positioning a mesh-like transport screen in which spaces in the screen are filled with the viscous material at a focal point of a laser, and irradiating the viscous material in one or more of the spaces of the screen with a beam from the laser, thereby causing one or more droplets of the viscous material to be jetted from the screen spaces onto a receiving substrate positioned across a gap from the mesh-like transport screen. The laser beam may irradiate the viscous material in the one or more spaces of the screen through a substrate disposed over the mesh-like transport screen, or through a substrate and a heat absorbing layer disposed over the mesh-like transport screen. By displacing the mesh-like transport screen and the focal point of the laser relative to one another at times between the jetting of the droplets of the viscous material from the screen spaces, structures may be formed on a receiving substrate through agglomeration of the jetted droplets thereon. For example, droplets of the viscous material may be jetted from the mesh-like transport screen so as to selectively overlap with one another on the receiving substrate according to cross-sections of an object being manufactured. Generally, irradiating the viscous material in one or more of the spaces of the mesh-like transport screen with the beam from the laser involves making the laser beam incident on the viscous material in a space of the mesh-like transport screen for a time sufficient to heat the viscous material in the space and form a droplet, and then continuing to keep the laser beam incident on the viscous material in the screen space for an additional time required for the droplet to separate from the mesh-like transport screen.

Still a further embodiment of the invention provides for laser-based droplet jetting of a viscous material by filling openings in a mesh-like transport screen with the viscous material, removing residual viscous material from the mesh-like transport screen, contacting a top surface of the mesh-like transport screen with a lower surface of a substrate, bringing a portion of the mesh-like transport screen into a working area at a laser beam focus, and operating the laser beam to heat the viscous material and jet a droplet towards a substrate or reservoir. By monitoring the positioning of the mesh-like transport screen within the working area using an imaging device prior to operating the laser beam to heat the viscous material, the relative position of the laser beam focus and the openings in the mesh-like transport screen may be adjusted so that the laser beam focuses at or near centers of the openings. Repeated iterations of the filling, removing, contacting, bringing, and operating steps, as needed, allow for printing an object in accordance with a desired shape. The relative positioning of the printing position at which droplet jetting takes place may be adjusted vis-à-vis the object during its fabrication.

These and further embodiments of the invention are described in greater detail below.

BRIEF DESCRIPTION OF THE DRAWINGS

The present invention is illustrated by way of example, and not limitation, in the figures of the accompanying drawings, in which:

FIGS. 3A-3C illustrate further examples of screens that may be used in accordance with embodiments of the present invention.

FIGS. 6A-6C illustrate the formation and jetting of ink droplets in accordance with an embodiment of the present invention.

FIGS. 8A-8D illustrate different laser-based jetting options in accordance with embodiments of the present invention.

FIGS. 9A-9C illustrate various printing configurations for 3D objects in accordance with embodiments of the present invention.

FIGS. 12A-12C illustrate a negative printing arrangement in accordance with embodiments of the present invention, which arrangement avoids undesired ink transfers as may occur in contact printing embodiments.

DETAILED DESCRIPTION

The present invention concerns DOD print heads well adapted for use with high viscosity inks for fabricating 2D and/or 3D patterns or structures. In systems and methods configured in accordance with embodiments of the present invention, a laser is used to create droplets of high viscosity ink, which droplets, when solidified in the aggregate, form 2D and/or 3D structures on a receiving substrate. In this technique, a substantially uniform layer of the viscous ink is coated on a mesh-like transport screen and retained within the open spaces thereof through adhesion to the mesh surfaces and surface tension. The ink-coated mesh is then brought to a working area and a laser is used to heat the ink within the holes of the mesh, causing ink droplets to be ejected. The 2D and/or 3D structure may be created through aggregation/merging of the droplets so jetted through laser inducement across a small gap to a substrate (non-contact printing), or through the removal of ink that will not contribute to a structure layer and then direct printing of the droplets onto a substrate in contact with the mesh-like transport screen (contact printing). With each printing technique, any of several methods may be used to apply the viscous ink to the mesh-like transport screen, and printing may occur one droplet at a time, or one-layer at a time, depending on the optical system used to focus the laser onto the ink target.

Figure 1A:
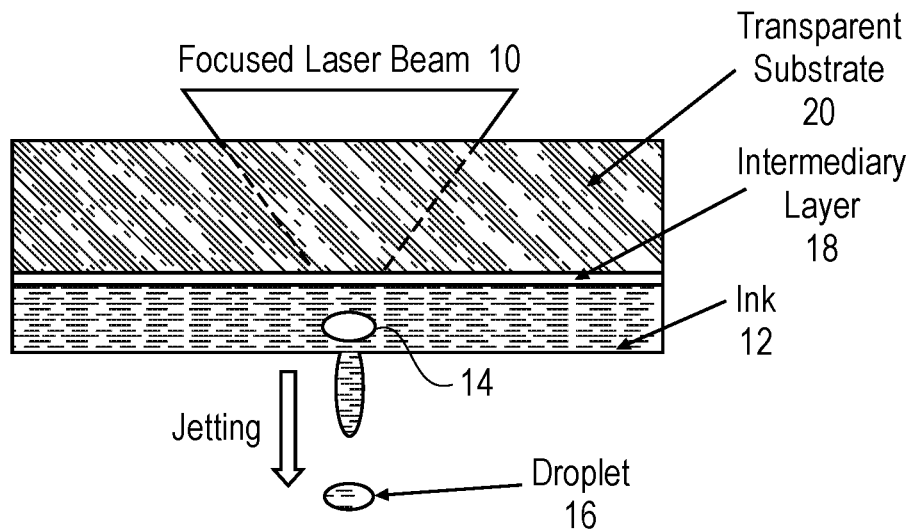
FIGS. 1A and 1B illustrate a comparison of conventional DOD printing (FIG. 1A) with the jetting technique of the present invention (FIG. 1B).
Figure 1B:
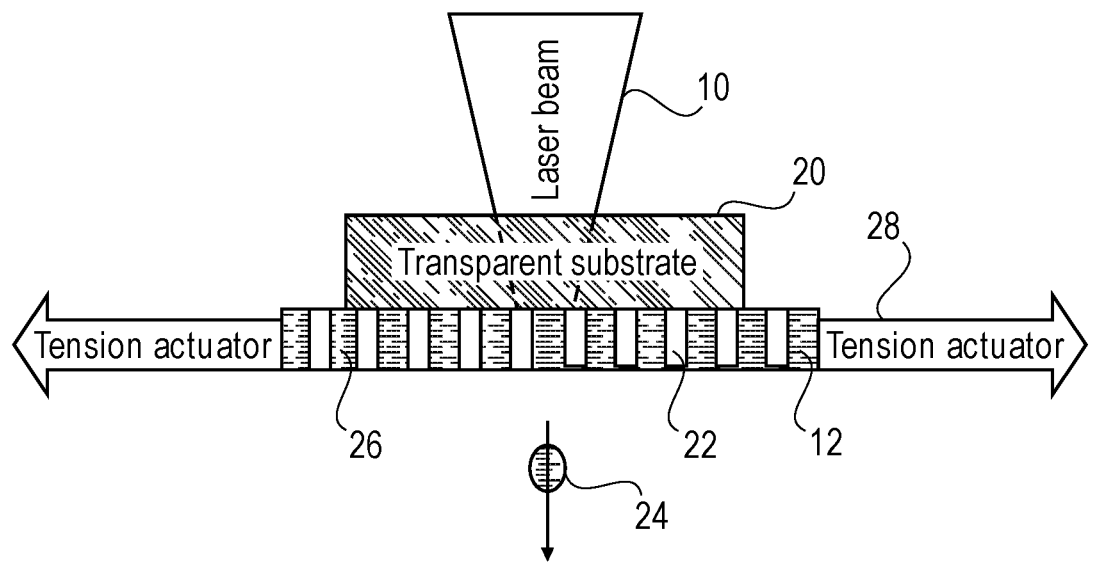

Referring first to FIGS. 1A and 1B, a comparison of conventional DOD printing (FIG. 1A) with the inventive jetting technique (FIG. 1B) is shown. In the conventional approach illustrated in FIG. 1A, a focused laser beam 10 is made incident upon a thin layer of ink 12 at a small working area 14. The laser heats the ink in the vicinity of the working area 14, causing a droplet 16 to be jetted towards a substrate (not shown). The thin layer of ink 12 is transported on an intermediary layer 18 (a carrier), which may be an absorbing layer, usually a metal layer or the like. The energy absorbed by the intermediate layer partially heats the liquid part of the ink and creates a micro-vapor bubble. The bubble is thermodynamically responsible for the droplet jetting. Typically, the ink layer is moved laterally with respect to the stationary laser, but the alternative approach can be used. Also, a transparent (at the laser wavelengths of interest) substrate material 20 may be positioned on the side of the intermediary layer opposite the ink layer to ensure the thin layer used as a transport medium does not bend or break.

Figure 14:
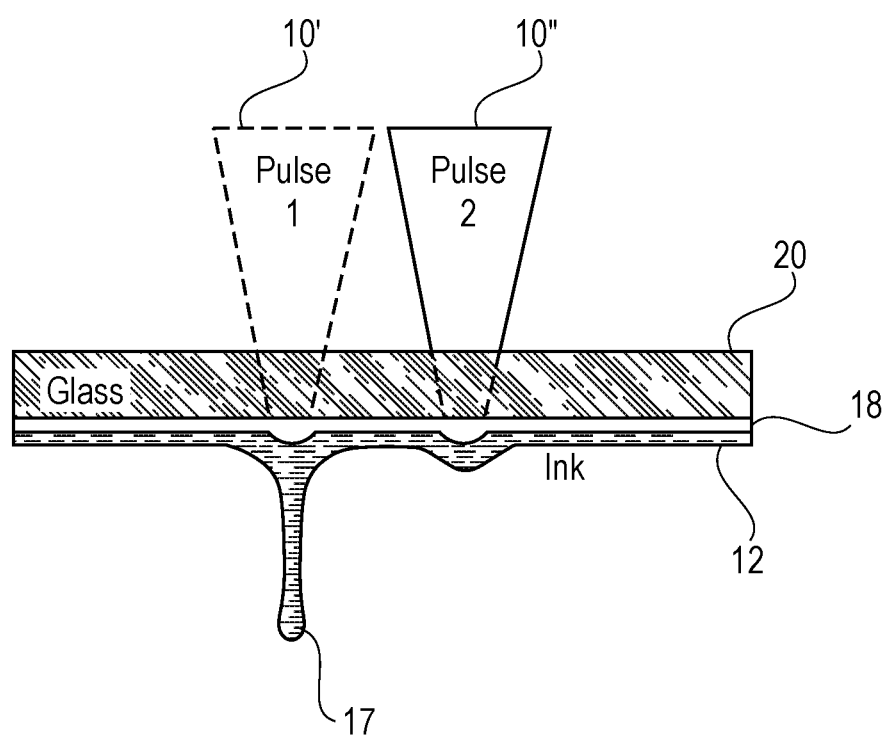
FIG. 14 illustrates the concept of a relaxation time inherent in conventional DOD printing, which limits a time between jetting of successive droplets.

One limitation of this conventional DOD printing is the wait times required between jetting of successive droplets. As shown in FIG. 14, when a first laser pulse 10' is applied, a droplet 17 begins to form. It takes time for the droplet to be fully jetted from ink layer 12 and, afterwards, there is an additional relaxation time for any ink that is not jetted to return to a level state in ink layer 12. During this relaxation time, an adjacent droplet cannot be produced because the ink layer 12 is not at the same state that it was when the droplet due to laser pulse 10' was applied. Only after the relaxation time can the second pulse 10" be applied to produce the successive droplet, otherwise the droplets will not be uniform in their consistency.

FIG. 1B now illustrates one embodiment of the jetting arrangement of the present invention. As in the case of the conventional arrangement, a focused laser beam 10 is made incident upon a thin layer of ink 12 at a small working area. In this arrangement, however, the thin layer of ink is transported into the working area using a mesh-like screen 22 with small holes or other openings therein 26 arranged in a periodic fashion. The openings in the screen may be as small as 30 μm or as large as 200 μm (or any size in between), and may be of regular (e.g., circular, square, rectangular, oval, triangular, etc.) or irregular shape. The screen is typically made of metal (e.g., a metal foil), but may be fabricated from other materials including, but not limited to, plastic, nylon, glass, quartz, etc. Preferably, the screen is made of a flexible material so that it can be accommodated on reels, as discussed further below, but in other embodiments a more rigid screen may be used and a transport mechanism which accommodates same may be employed (e.g., an actuator that moves an entire screen at a time in one or two dimensions in a plane).

In operation, the laser is focused onto an opening 26 (or an area adjacent to an opening) through a transparent (at least at the laser wavelength(s) of interest) substrate 20 and the ink within the opening is heated, causing a droplet 24 to be jetted towards a substrate or an ink reservoir (not shown in this view). Droplet 24 is approximately the same size as opening 26 and has a volume approximately equal to the volume of ink contained within the opening 26. As explained further below, the ink, which is typically a highly viscous material (e.g., >50 mPa s), such as a viscous liquid (e.g., a polymer, curable resin, etc.) or nanoparticle suspension, is coated onto the screen 22 in a uniform layer (with any excess being removed prior to exposure to the laser), and is retained within the openings 26 through adhesion to the mesh surfaces and surface tension. The mesh screen 22 is retained under tension (e.g., lateral strain with respect to the plane of the screen) 28 as it is transported through the working area by one or more actuators. In one embodiment, the screen is maintained under tension by being wound onto reels, one or more of which is positioned before (as viewed from the standpoint of screen direction of travel) an ink application area and the other(s) of which may be positioned after a screen cleaning area. In some instances, the screen transport and tensioning mechanism may be configured to operate in both forward and reverse directions, and depending on the direction of travel of the screen, an ink application area may also be used as a screen cleaning area, and vice-versa. This aspect of the present invention is described in greater detail below.

Several advantages are provided by the jetting arrangement of the present invention over that of conventional DOD printing apparatus. For example, a speed advantage exists inasmuch as there is no physical interaction between ink areas used to produce successive droplets. The screen-like mesh accommodates the ink in individual openings, each of which is a reservoir for an individual droplet. Therefore, the laser may be directed between individual openings rapidly, without having to wait for any recovery times as in the conventional DOD technique discussed above. The use of the screen-like mesh also makes possible the printing of an entire layer at a time, because each droplet is created from its own individual ink reservoir in a mesh opening, and the creation of one droplet does not impact the creation of another.

Further, the present jetting arrangement allows for the use of lower cost lasers. Whereas the conventional DOD technique demands the use of high energy pulsed lasers, the present jetting arrangement allows for the use of lower energy continuous wave (CW) lasers because the jetting of each droplet from its own individual opening in the screen-like mesh assures consistency among droplet size and volume. Indeed, the use of the screen-like mesh makes the jetting system of the present invention simpler overall than DOD systems of the past because the screen-like mesh itself, that is the size and shape of the openings therein, can define the droplet volumes, etc., and one need not rely on precise ink layer thicknesses and laser energies to fashion droplets of desired characteristics. Moreover, the use of the screen-like mesh as an ink transport medium also helps to reduce waste because unused ink can be reclaimed from the mesh, as discussed further below. Conventional DOD printing apparatus do not provide for such reclamation.

Figure 2:
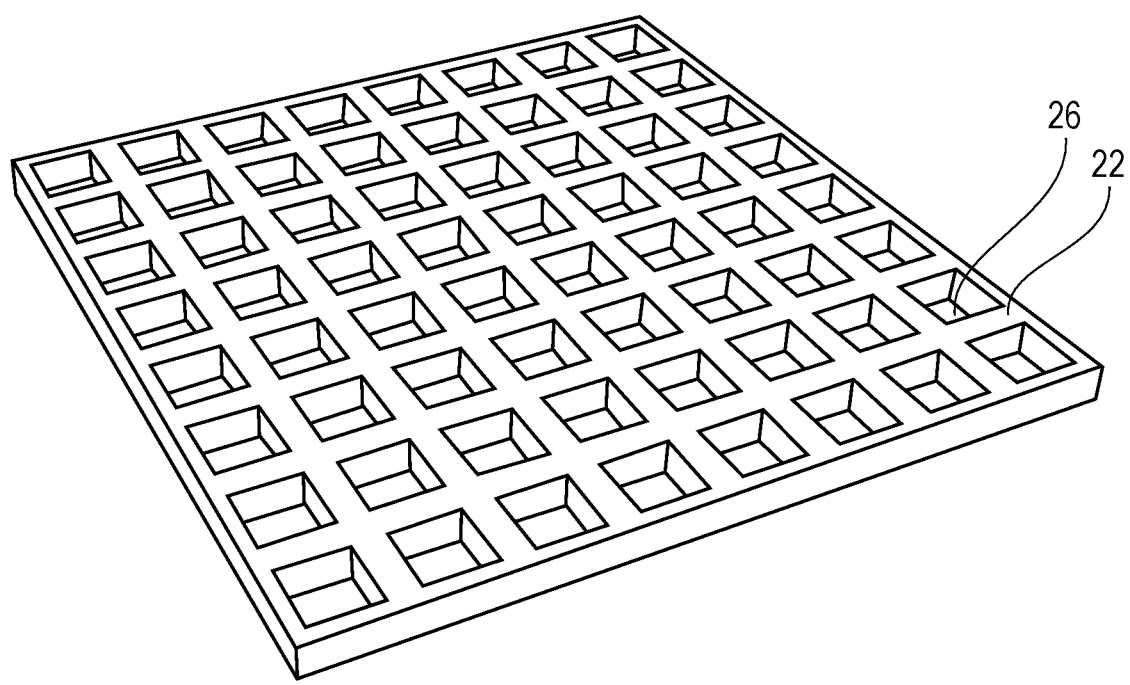
FIG. 2 illustrates a perspective view of one example of a screen having square-shaped openings for use in a laser-based droplet jetting technique according to an embodiment of the present invention.

FIG. 2 illustrates a perspective view of one example of a screen 22 having square-shaped openings 26. In this example, the screen 22 is a regular array of openings 26 having an equal number of openings in each of two planar dimensions. In other embodiments, the screen may be formed as an elongated roll of the mesh-like material from which it is made and, as discussed below, dispensed from one or more rollers into the working area. FIG. 2 therefore should be regarded as illustrative of one example of a portion of a screen, rather than implying that screens for use in embodiments of the invention must be of fixed, regular shape.

FIGS. 3A-3C illustrate further examples of screens that may be used in accordance with embodiments of the present invention. In FIG. 3A, the screen 22 consists of woven materials, e.g., metals, polymers, etc., with the weave forming mostly regular openings 26 having approximately equal, square-shaped areas. In FIG. 3B, the screen 22 has a thicker cross section that that of the screen in FIG. 3A with mostly regular openings 26 having approximately equal, diamond-shaped volumes. In FIG. 3C, a screen is fashioned so that the openings 26 have approximately equal, hexagon-shaped volumes. Of course, many other screens with differently shaped openings of different volumes may be used. The shape and volume of the openings, as well as the viscosity and composition of the ink material that fills the openings, will influence the size and volume of the droplets jetted therefrom, hence, the selection of inks, screen materials, and screen configuration (e.g., volume and shape of openings 26) are important to the results obtained by the jetting operations. In some embodiments, the screen 22 could be made of a plastic foil such as polyethylene terephthalate (PET), polyethylene naphthalate (PEN), or polyimide (e.g., Kapton™). Also, the mesh structure of the screen may be fashioned by laser drilling of such a foil. In this way the thickness of the foil and the opening dimensions of the screen may be controlled independently of one another (e.g., the thickness of the foil could be 25 μm and the diameter or length/width of the openings 100 μm).

Figure 4:
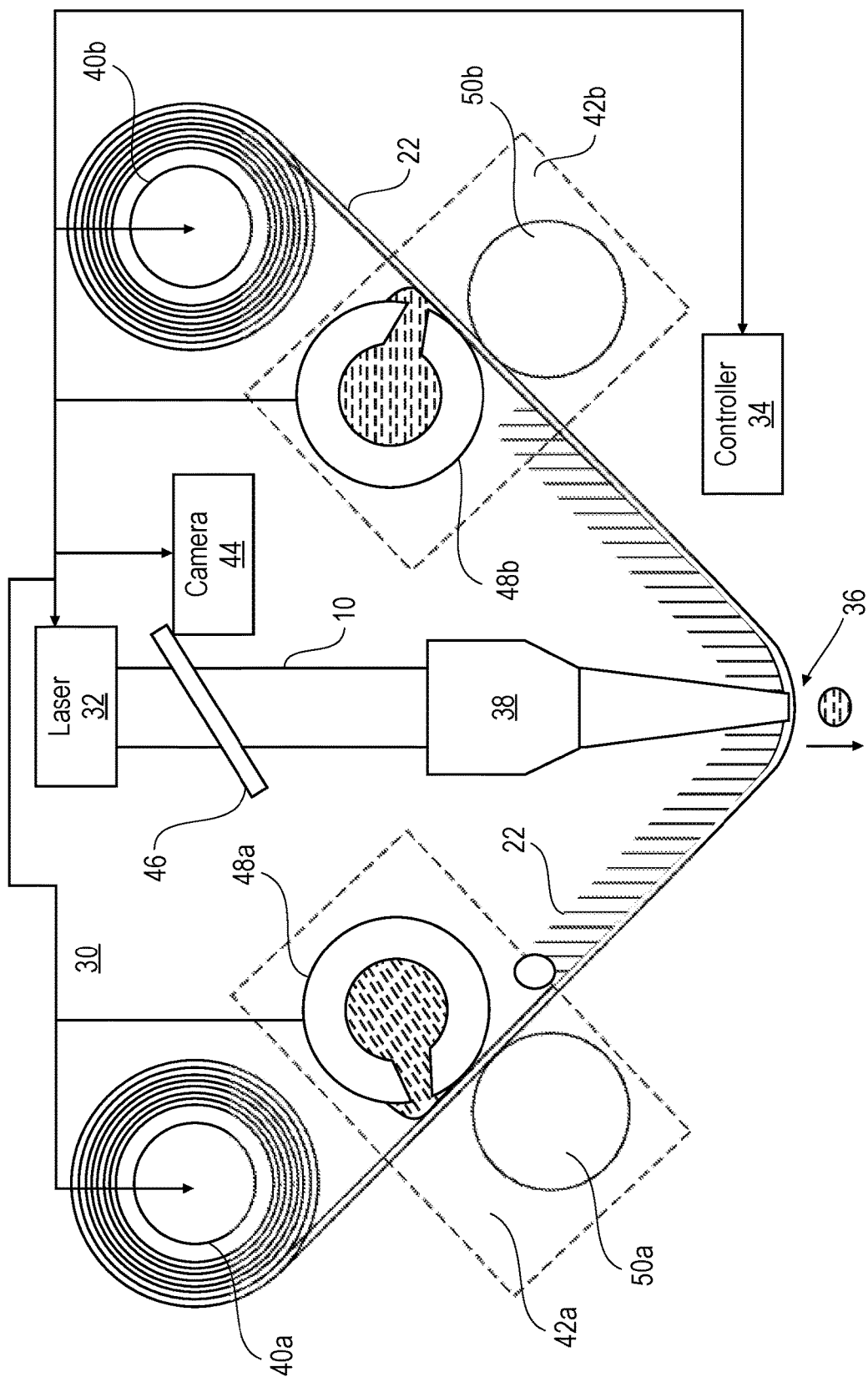
FIG. 4 illustrates one example of an apparatus for laser-based droplet jetting configured in accordance with an embodiment of the present invention.

Turning now to FIG. 4, one example of an apparatus 30 for additive manufacturing, in particular, an apparatus that employs a laser to create droplets from a donor material, which droplets, when solidified in the aggregate, form a 3D structure, configured in accordance with the present invention is illustrated. In the laser-based jetting system 30, a laser 32 is operated under the control of a processor-based controller 34 to emit a laser beam 10 towards a working area 36. A screen 22 having a thin coating of a viscous ink is transported through the working area 36 and the laser 32 is operated so that the beam 10 is focused, via optics 38, upon openings in the screen in which the ink is present. The ink so exposed to the laser is heated and resulting droplets 24 are jetted from the screen towards a substrate or an ink reservoir (not shown in this view). Preferably, the screen 22 is transported through the working area 36 in close proximity to, or touching, transparent substrate 20. The screen 22 is supported along its length by the transparent substrate 20 to ensure the screen does not bend or break. Examples of materials which may be used for substrate 20 include fused quartz, fused silica, and ceramic glass.

As shown in the illustration, the screen 22 is elongated in at least one dimension (e.g., is longer than it is wide) and is taken up on reels 40a and 40b outside of the working area 36 and the bi-lateral ink application/cleaning areas 42a, 42b. Reels 40a, 40b serve to both act as storage units for the screen 22 and as tensioning units. Screen 22 is maintained under lateral strain between reels 40a and 40b in order to preserve its shape and the shape and size of each opening therein. The reels are operated under the control of control unit 34 to advance in one direction or the other by a fixed amount between laser pulses. For example, consider a screen 22 which is only one opening wide. The screen would be advanced in a forward direction (from the standpoint of an ink application area) by a distance of one opening between each pulse of laser 32. Stepper motors associated with both reels 40a, 40b may be used to precisely control the distance of advance. In most applications, screens of more than one opening width will be used, and so while the screen may advance in one dimension, the laser may translate in an orthogonal or other direction for some distance between each advance of the screen. Alternatively, entire layers may be printed at a time and the screen advanced by multiple opening widths between printings. Such embodiments are described further below. Also, the screen may be advanced by more than one opening's width, even in cases of raster scans (described below). Little or no ink is wasted even in such embodiments because ink can be reclaimed from the screen in one of the ink application/cleaning areas 42a, 42b prior to being taken up on a reel 40a, 40b.

As shown in FIG. 4, a camera 44 and mirror 46 arrangement is used to assist in precise positioning of the laser beam 10. Typically, at start up, a calibration process is performed so as to ensure that the laser pulses are focused on the openings in the screen 22. The laser 32 (and optics 38) are preferably translatable in one, two, or three dimensions with respect to screen 22 and working area 36 so as to position the focus area of the laser on the openings. The calibration process may include adjusting, using controller 34, the stepper motors associated with reels 40a, 40b to control the amount of travel of screen 22 between laser pulses and adjusting one or more stepper motors or other translation arrangement associated with the translation of laser 32 and optics 38 between screen openings of a common raster line, etc.

Figure 5:
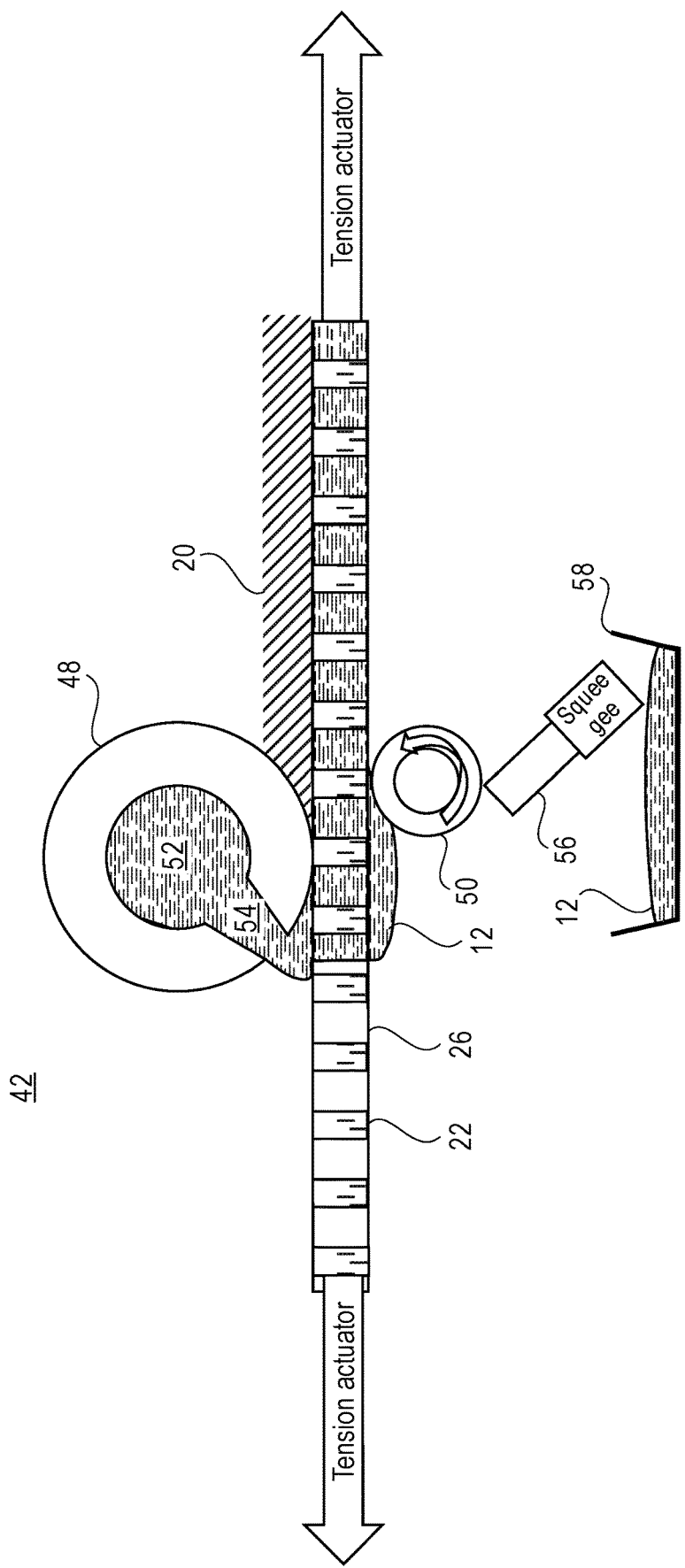
FIG. 5 illustrates an example of an ink application/cleaning area for the apparatus shown in FIG. 4.

Ink application/cleaning areas 42a, 42b include application rollers 48a, 48b and squeegee rollers 50a, 50b, respectively. An example of one ink application/cleaning area 42 is illustrated in detail in FIG. 5. Within the ink application/cleaning area 42, the screen 22 is drawn between an application roller 48 and squeegee roller 50. As the screen passes beneath the application roller 48, a film of ink 12 is applied to the top surface of the screen. Roller 48 includes an ink reservoir 52 and the ink passes from this reservoir through an application slot 54 onto screen 22 at the leading edge (as viewed from the direction of travel of screen 22) of the application area 42. In some embodiments, the ink application could be made by an independent dispenser external to roller 48, which would act to press the ink into the mesh openings. Then, as the screen 22 passes beneath roller 48, the ink is pressed into the openings 26 in the screen. At the trailing edge of roller 48 is a leading edge of transparent substrate 20, which helps to ensure that any excess ink is pressed into the screen openings and any air is removed.

On the underside of the screen 22, approximately vertically beneath the trailing edge of roller 48, is positioned a squeegee roller 50. Squeegee roller 50 rotates opposite to the direction of travel of screen 22 at the location it comes into contact with screen 22 and serves to remove any excess ink from the bottom of screen 22. This ensures that the thin layer of ink 12 is confined to the openings 26 in screen 22. A squeegee blade 56 positioned against the surface of squeegee roller 50 at a position that is downstream of the squeegee roller coming into contact with screen 22 (from the standpoint of the rotation of the squeegee roller) removes any ink picked up by the squeegee roller and deposits same into a collection tank 58. In some embodiments, the squeegee roller 50 may be absent, and the squeegee blade 56 may be in direct contact with the underside of screen 22 to remove any excess ink.

Returning to FIG. 4, an alternative to using stepper motors with rollers 40a, 40b is to use piezo translators that include a piezo ceramic that expands in a defined direction upon application of an electric current (e.g., under the control of controller 34). The ceramic is orientated so that when it expands (at the application of a current under the control of controller 34), screen 22 is moved along a single axis (e.g., parallel to its longest dimension), along the direction of the expansion of the crystal, e.g., by friction. Generally, a number of piezo translators may be used to move the screen and the various piezo translators may be energized at the same time (or nearly so) so that their actions are coordinated with one another. Thus, the piezo translators may be arranged so that they impart longitudinal motion to the screen in the same direction and the translation distance may be proportional to the magnitude of the current applied to the piezo translators. In some embodiments, the translation distance of the screen for each activation of the piezo translators is on the order of a few tens of nanometers to a few microns—i.e., the distance between centers of adjacent openings in the screen mesh. Preferably, the reel on which the spool of the screen is maintained is mounted on an axial pin or other element (not shown) with frictionless, or nearly so, bearings so as to provide minimal resistance when the screen is translated by the piezo translators. Piezo translators may also be used to translate the laser 32 in one or more directions, e.g., for a raster-like scan pattern, etc.

The piezo translator(s) employed in embodiments of the present invention may be any of: longitudinal piezo actuators, in which an electric field in the ceramic is applied parallel to the direction of its polarization; piezoelectric shear actuators, in which the electric field in the ceramic is applied orthogonally to the direction of its polarization; or tube actuators, which are radially polarized and have electrodes are applied to an outer surfaces of the ceramic so that the field parallel to its polarization also runs in a radial direction. In other embodiments, one or more piezo translators may be arranged to rotate the reels 40a, 40b on which the spools of screen 22 are carried about respective central axes, playing out and taking up the screen 22. Such an arrangement may be used in combination with the linear translators described above, with the multiple piezo translators arranged to actuate at the same time under the control of controller 34.

In one embodiment, controller 34 includes a processor that executes computer-readable instructions (i.e., computer programs or routines) defining methods as described herein, which methods are instantiated and run on non-transitory computer-readable media. Such processes may be rendered in any computer language and executed on any suitable programmable logic hardware. Processor-based controllers 34 upon or with which the methods of the present invention may be practiced will typically include a bus or other communication mechanism for communicating information; a main memory, such as a RAM or other dynamic storage device, coupled to the bus for storing information and instructions to be executed by the processor and for storing temporary variables or other intermediate information during execution of instructions to be executed by the processor; and a ROM or other static storage device coupled to the bus for storing static information and instructions for the processor. A storage device, such as a hard disk or solid-state drive, may also be included and coupled to the bus for storing information and instructions. The subject controller may, in some instances, include a display coupled to the bus for displaying information to a user. In such instances, an input device, including alphanumeric and/or other keys, may also be coupled to the bus for communicating information and command selections to the processor. Other types of user input devices, such as cursor control devices may also be included and coupled to the bus for communicating direction information and command selections to the processor and for controlling cursor movement on the display.

The controller 34 may also include a communication interface coupled to the processor, which provides for two-way, wired and/or wireless data communication to/from the controller, for example, via a local area network (LAN). The communication interface sends and receives electrical, electromagnetic, or optical signals which carry digital data streams representing various types of information. For example, the controller 34 may be networked with a remote unit (not shown) to provide data communication to a host computer or other equipment operated by a user. The controller can thus exchange messages and data with the remote unit, including diagnostic information to assist in troubleshooting errors, if needed.

In operation, the system may be used for forming a 3D article by fusion of droplets 24 in forms defined by cross-sections of the object under construction. For example, a first layer of individual droplets may be distributed over a receiving medium (not shown). This may be accomplished by depositing the droplets while moving the receiving medium with respect to the nozzle area between successive droplets to form the relatively thin, approximately uniform layers of ink on the receiving medium and, successively, on previously jetted layers. Once jetted, the droplets cool and solidify in place. Alternatively, entire layers may be printed at a time.

Controller 34 is programmed to cause the laser 32 to emit pulses, thereby creating droplets 24, at times corresponding to the necessary application of ink for forming the cross-section of the article under fabrication. This may be done, for example, by providing images of cross-sections, and ensuring that the droplets are jetted when a portion of the receiving medium is positioned below the working area 36 at a point for which material is needed. After each droplet is jetted, controller 34 causes screen 22 and/or laser 32 to translate by one or more screen openings in preparation for the next application of the laser pulse. At or about the same time, the controller 34 may cause the receiving medium to be displaced relative to the working area 36 to a next position at which a droplet is to be jetted. The fusion of droplets in locations on the receiving medium corresponding to the image of the cross-sectional layer of the object to be fabricated form an integral layer of ink having a shape corresponding to that image. In addition, supporting structures may be fabricated during production of the object and later removed. Successive layers of droplets are jetted on top of one another to complete the object. Alternatively, entire layers may be fabricated at a time, one on top of the other, until the object under fabrication is complete. In such an arrangement, the screen is translated relative to the laser to bring fresh ink into the working area, but the laser and the receiving medium need not be moved.

During the fabrication process, images of the working area 36 and/or the object under fabrication may be taken (successively or continuously) e.g., using one or more imaging devices such as camera 44. By evaluating images of the layers as they are being formed, the laser light incident on the screen openings may be controlled in accordance therewith. For example, an image of a cross-sectional layer of the 3D article used to produce the article under fabrication may be modified according to feedback provided by one or more imaging devices so that one or more areas of the image are adjusted from those associated with an original version of image. Such feedback may be used to compensate for inadequate deposition in one or more areas and/or variations in droplet displacement prior to cooling sufficiently to fuse with a portion of an existing structure. Similarly, images of the working area may be used to control positioning of the screen openings relative to the laser beam 10 at or near the working area.

Further, although not shown in detail, one should recognize that systems such as that illustrated in FIG. 4 may be configured with one or more lasers, for example dedicated lasers for different working areas 36. Also, components of the system may be under the common control of a single controller or multiple such controllers configured to act in concert with one another either through appropriate programming, networked communications (with one another and/or a remote unit), or both. Such systems may be useful for jetting arrangements in which different materials are used, and/or where the presence of multiple spools of screens speeds fabrication of a single object.

Figure 6B:
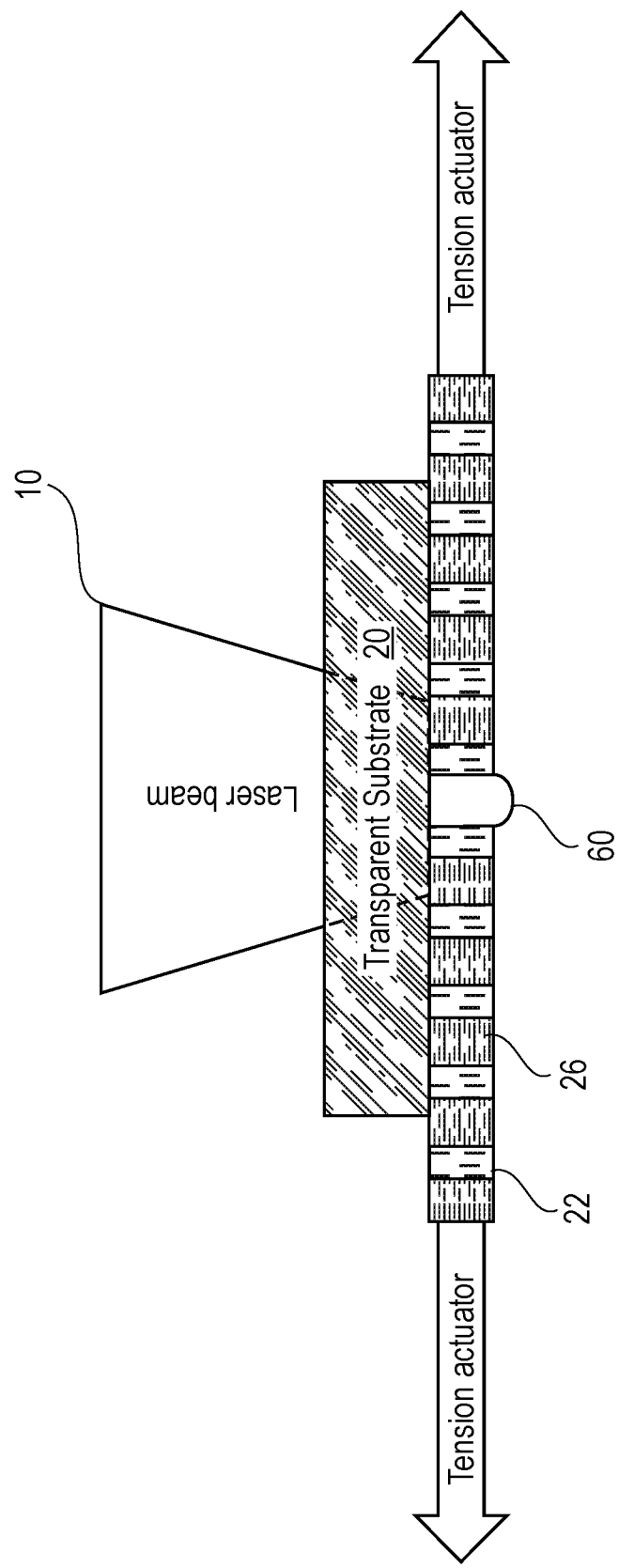
Figure 6C:
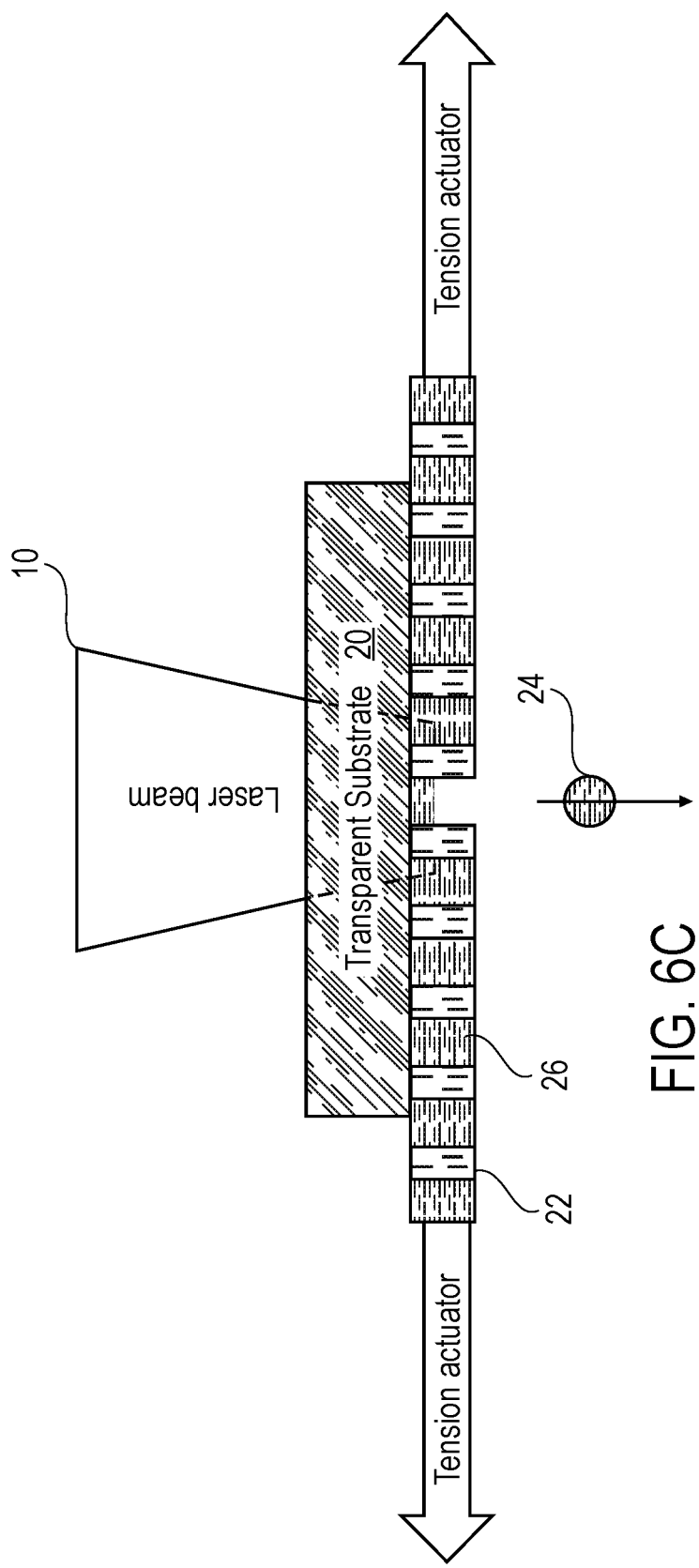

FIGS. 6A-6C illustrate the formation and jetting of ink droplets. As shown in FIG. 6A, the screen 22 is positioned so that an opening 26 is at a focal point of laser beam 10. The laser beam irradiates the ink in the screen opening through transparent substrate 20. The substrate 20 is transparent (or nearly so) at the wavelength of the laser light, so that the energy imparted by the laser light is primarily absorbed by the ink, causing the droplet to be jetted from the screen opening. Substrate 20 is preferably made of a hydrophobic material, or is coated with a hydrophobic coating. The substrate may be formed of a foil, a solid, or even a gel material. Although not shown in this figure, the screen 22 may be in close proximity to a receiving substrate on which the droplet is deposited. Jetting overlapped droplets in this fashion in shapes defined by cross-sections of the object being manufactured results in the formation of the object.

In FIG. 6B, the laser has been incident on the ink in a screen opening 26 for a brief time. As a result, the ink is heated and an ink droplet 60 has started to jet from the screen opening. With further application of the laser, as shown in FIG. 6C, the droplet 24 separates from the screen 22, due to mechanical and thermodynamical perturbation, and travels towards the receiving substrate (not shown).

Figure 7:
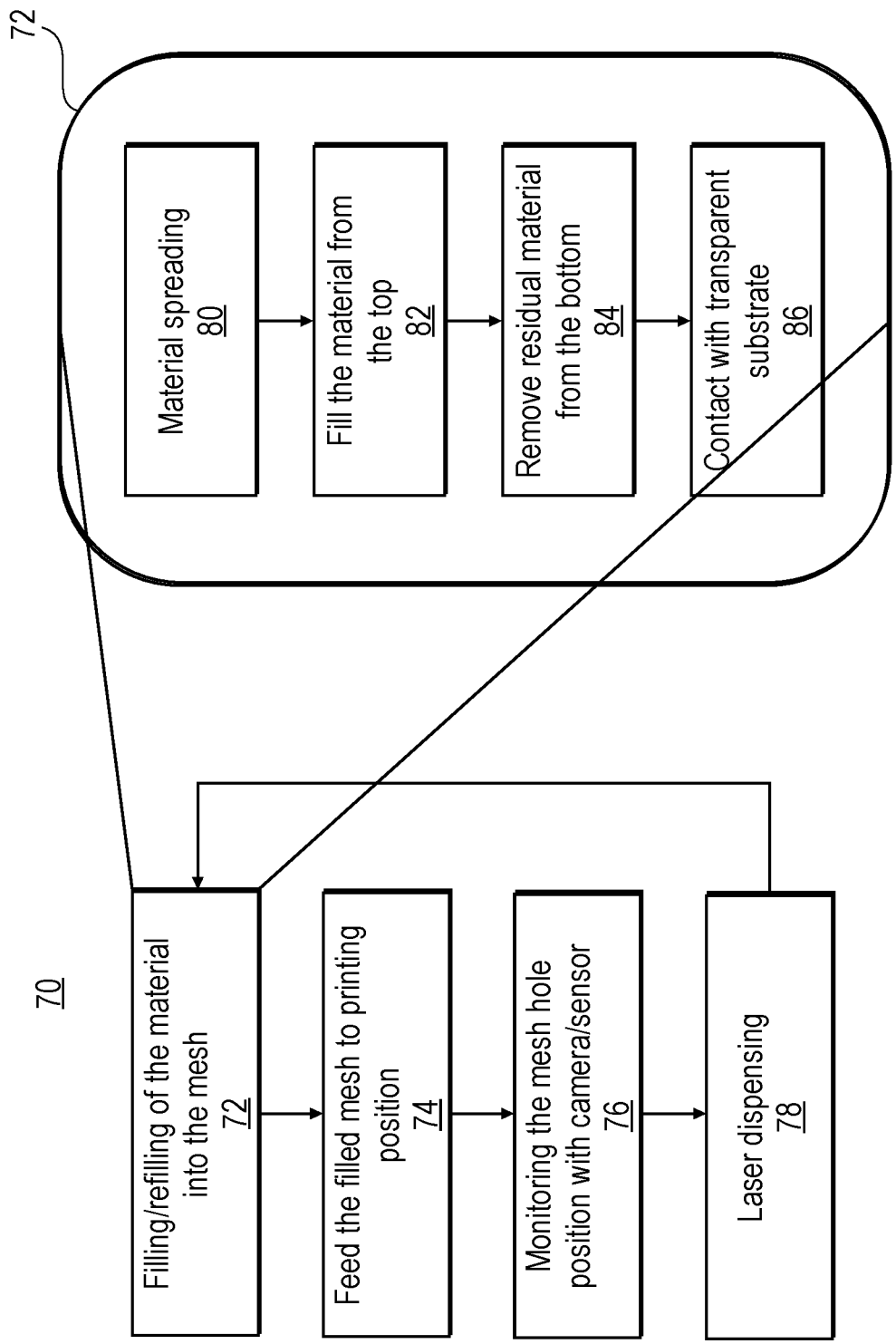
FIG. 7 illustrates an example of a workflow for the formation and jetting of ink droplets from donor materials in accordance with embodiments of the present invention.

FIG. 7 illustrates an example of a workflow 70 for employing a laser to create droplets from donor materials, which droplets, when solidified in the aggregate, form 3D structures in accordance with embodiments of the present invention. At 72, ink is filled or refilled into openings in the screen mesh. As shown in the expanded view at the right side of the drawing, this step involves spreading the ink from a reservoir onto the screen mesh 80, filling the mesh openings from the top 82, removing residual ink from the bottom of the screen 84, and contacting the top surface of the screen with the lower surface of the transparent substrate to remove any residual ink and air 86. Once the screen mesh openings have been filled with ink, that portion of the screen mesh is brought into the working area at the laser beam focus 74. Using a camera or other imaging instrument, the focus area of the laser is monitored, and the relative position of the laser and screen mesh openings are adjusted so that the laser focuses at or near the center of the screen mesh openings 76. The laser beam is then operated to heat the ink and jet an ink droplet towards a waiting substrate or reservoir 78. This process repeats as needed, with the relative position of the printing position being adjusted vis-à-vis the object being fabricated so as to print the object in accordance with the desired shape.

Figure 8A:
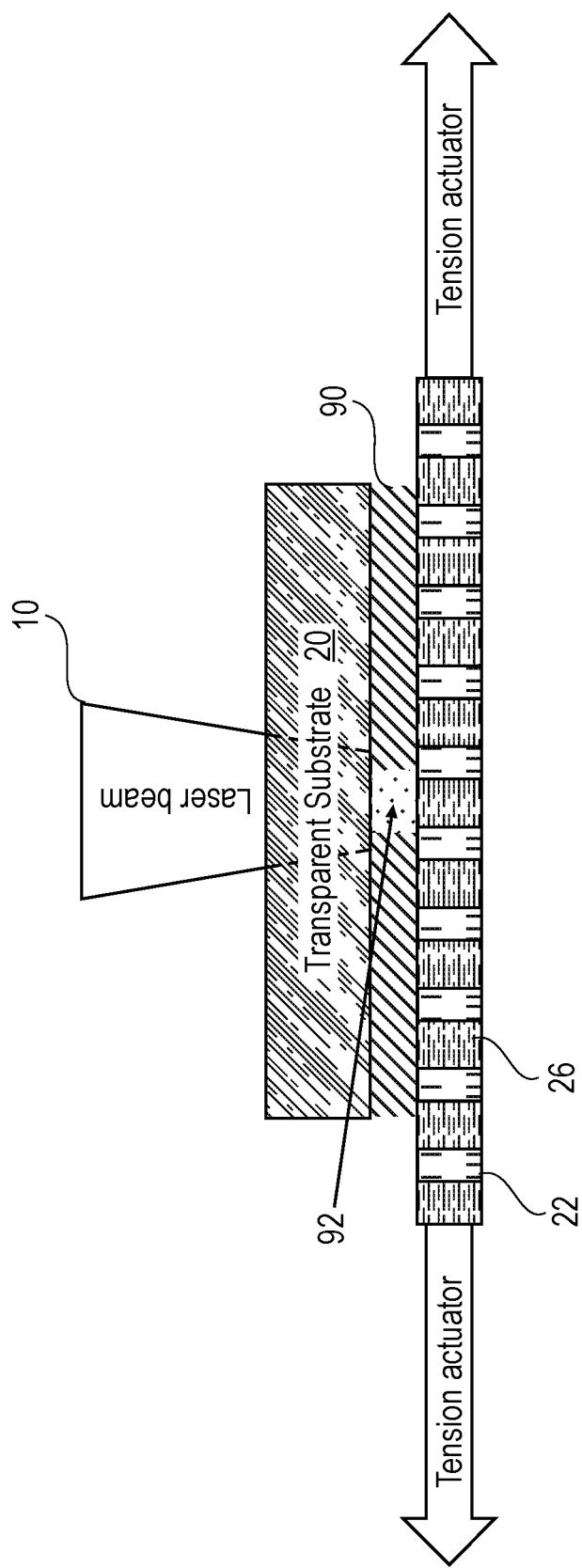

FIGS. 8A-8D illustrate different laser-based jetting options in accordance with embodiments of the present invention. In FIG. 8A, an intermediate absorbing layer 90 is introduced in between the transparent substrate 20 and the top surface of the screen mesh 22. The intermediate absorbing layer may be coated on the substrate or printed on the mesh after the mesh openings 26 are filled with ink. Or, it may be a separate layer distinct from both the transparent substrate 20 and the screen mesh 22. The intermediate absorbing layer 90 absorbs heat produced as a result of the laser beam 10 being incident on a small area so that the heated area 92 is within the absorbing layer 90 and not the ink 12 in an opening 26. This can help prevent over-heating of the ink 12.

In FIG. 8B the transparent substrate 20 itself acts as an absorbing layer and/or an intermediate absorbing layer is incorporated in the transparent substrate 20. In this embodiment, the heated area 92' is a lower portion of the transparent substrate and/or an upper portion of the ink in a screen mesh opening 26. Such an embodiment may be well suited for use with a fast laser in the UV wavelengths.

Figure 8C:
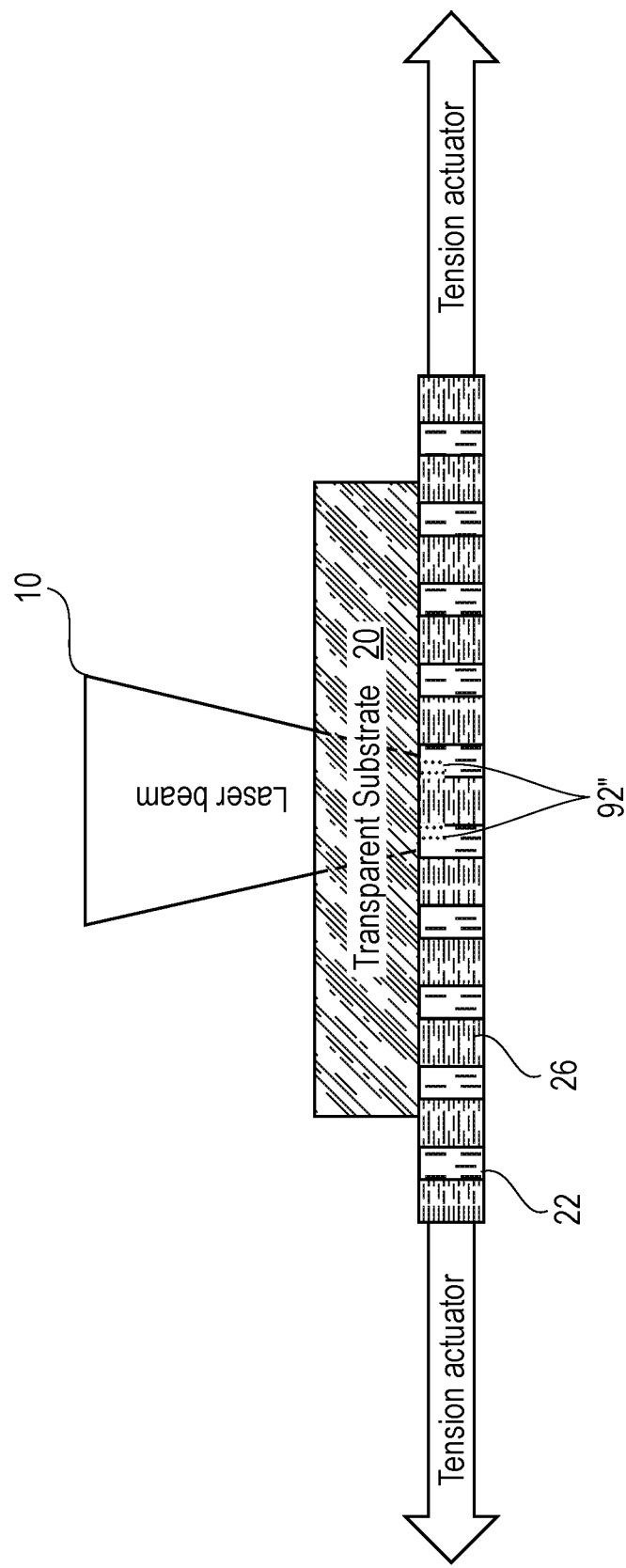
Figure 8D:
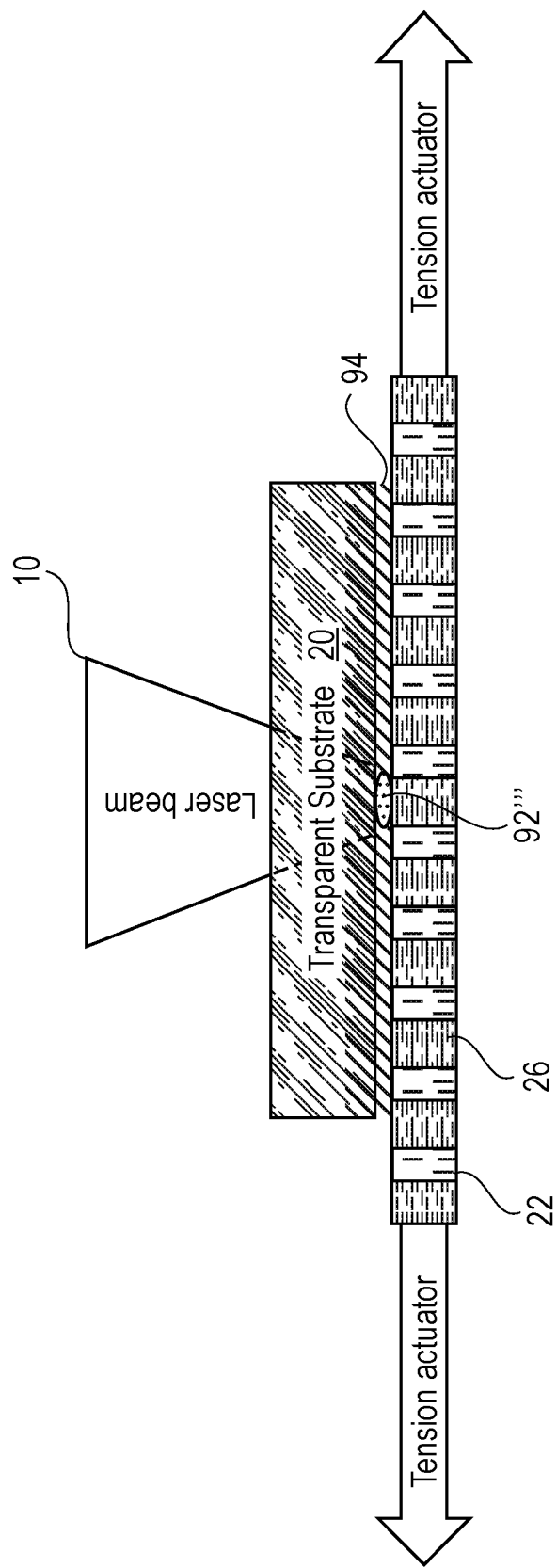

In FIG. 8C, the screen mesh acts as an absorbing layer, with heated areas 92" being the sidewalls of a screen opening 26. Screens made of metal may be well suited for use as heat absorption materials and the wavelength of the laser selected to provide optimal heating of such materials. Still another arrangement is shown in FIG. 8D, in which an intermediate material 94 is introduced between the transparent substrate 20 and the top surface of the screen mesh 22. This intermediate layer 94 may be coated or sprayed on the mesh after the mesh openings 26 are filled with ink, and is an exploding or bursting material that, upon heating, will propel the ink from the opening in the screen mesh. In this case, the heated area 92''' is within the intermediate layer 94.

Turning now to FIGS. 9A-9C, various printing configurations for 3D objects are described. In these illustrations a raster-like printing arrangement with a single spot laser is shown. In FIG. 9A, printing system 100 includes the laser beam 10 being focused by optical arrangements 102a, 102b onto a screen mesh donor 106 having openings filled with ink or another donor material. The donor 106 is positioned above and close to a receiver substrate 108, on which the ink drops will accumulate and solidify to form the object undergoing fabrication. The laser beam 10 is scanned in one, two, or three dimensions using a scanner arrangement 104. In particular, as shown in FIG. 9B, the laser beam 10 is scanned in a raster-like pattern 110 across the openings of the screen and is focused at screen openings corresponding to the layer 112 of the object undergoing fabrication in order to form a layer 114 on the receiver substrate 108, as shown in FIG. 9C. Note that the illustration in FIG. 9B shows a raster pattern 110 as if the screen mesh donor layer 106 were stationary, but this need not necessarily be the case. As mentioned above, the screen mesh may be translated in one direction to expose ink-filled openings to a working area of the laser, the laser may then be scanned in an orthogonal direction, being focused at each ink-filled screen opening in the current scan line, and then the screen mesh may be translated by a single opening's width and the laser scanning process repeated. The result is a similar raster-like scan pattern being traced over the extend of the grid, but the receiver substrate and laser would be moved accordingly to result in fabrication of the layer 114 of the object.

Figures 10A, 10B, 10C:
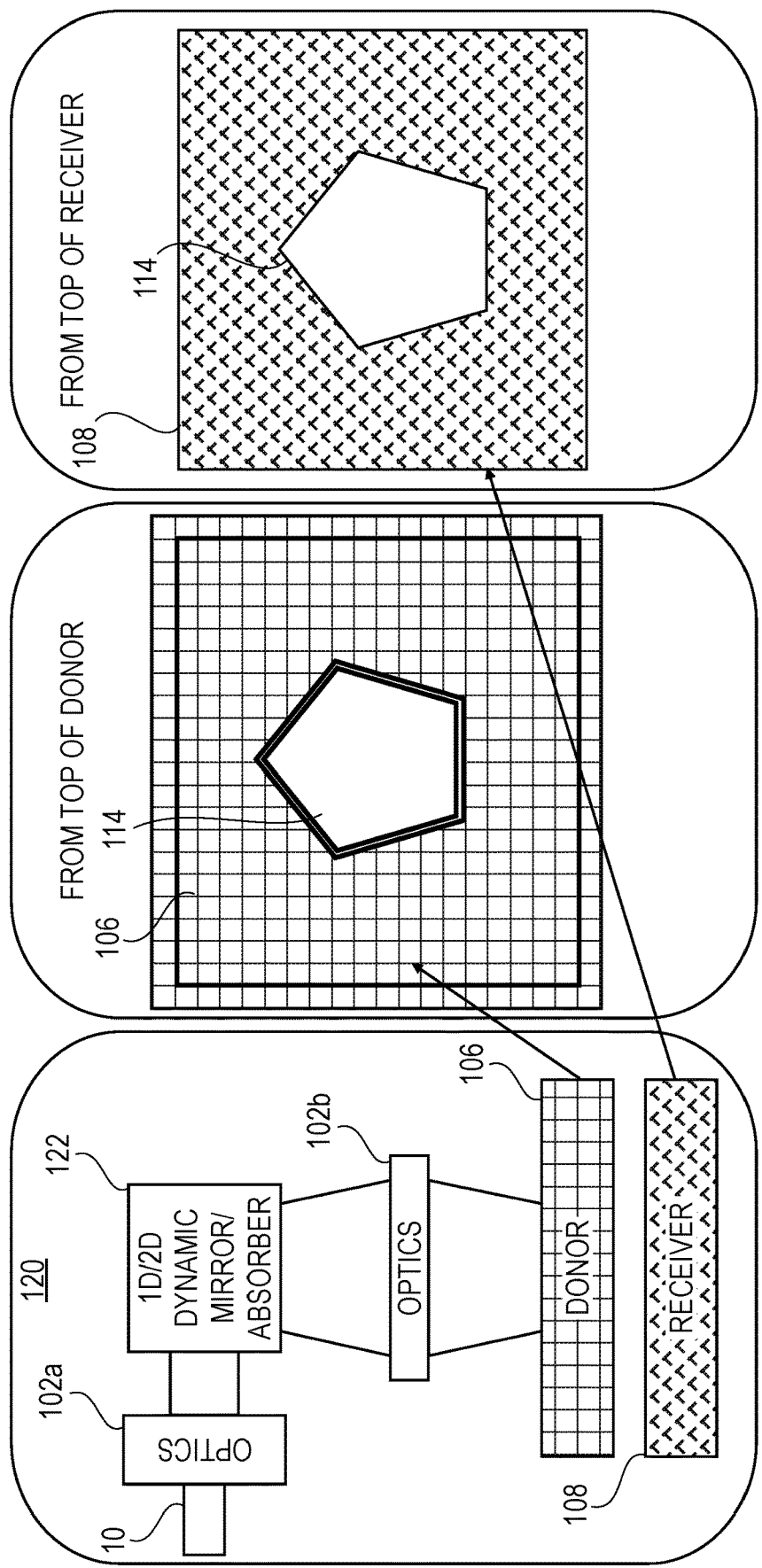
FIGS. 10A-10C illustrate an alternative printing system in which an entire layer at a time is printed, in accordance with embodiments of the present invention.

FIGS. 10A-10C illustrate an alternative printing system 120, which prints an entire layer 114 at a time using a dynamic micromirror assembly or micro modulator 122 or spatial light modulation device in the optical path of laser beam 10. For example, spatial light modulation of the laser beam 10 to form a spatial light modulated laser beam incident on donor layer 106 may be accomplished by generating a holographic image of a respective cross-sectional layer 114 of the object to be fabricated on a liquid crystal on silicon (LCoS) panel, directing a non-spatial light modulated portion of the laser beam 10 to be incident on the holographic image, and using a reflected portion of the laser beam from the holographic image of the cross-sectional layer of the object on the LCoS panel as the spatial light modulated laser beam incident on donor layer 106. In such instances, the holographic image of the cross-sectional layer of the object on the LCoS panel maybe corrected for diffraction effects and/or other image effects in the spatial light modulated laser beam at an image plane. In alternative embodiments, spatial light modulation of the laser may be effected through use of a digital micromirror device (DMD), which may be controlled to produce a representation of the cross-sectional layer of the object to be fabricated. DMDs are commonly used in digital light projectors and typically include many microscopic mirrors arranged in an array. The mirrors, which correspond to pixels in an image, can be individually rotated to an "on" or "off" position, thus allowing for selected pixels of an incident laser be to be reflected or not. DMDs thus provide amplitude spatial light modulation of the incident laser beam.

One benefit of such an arrangement is that it avoids the need for scanning of the laser onto individual openings ("cells") of the screen mesh. Instead, the laser beam that is incident on the donor layer 106 acts to print an entire layer 114 at a time. Of course, because the beam width of the laser incident on the donor layer 106 is much wider in this arrangement than in system 100, it may take longer to jet individual droplets because the energy incident on the ink in an individual screen mesh opening will be reduced from that which it might be in system 100. To accommodate rapid printing times, it may therefore be desirable to preheat the screen mesh and ink using a heater (e.g., an infra-red heater), and/or to use lasers of greater energy than as with system 100.

Figure 11A:
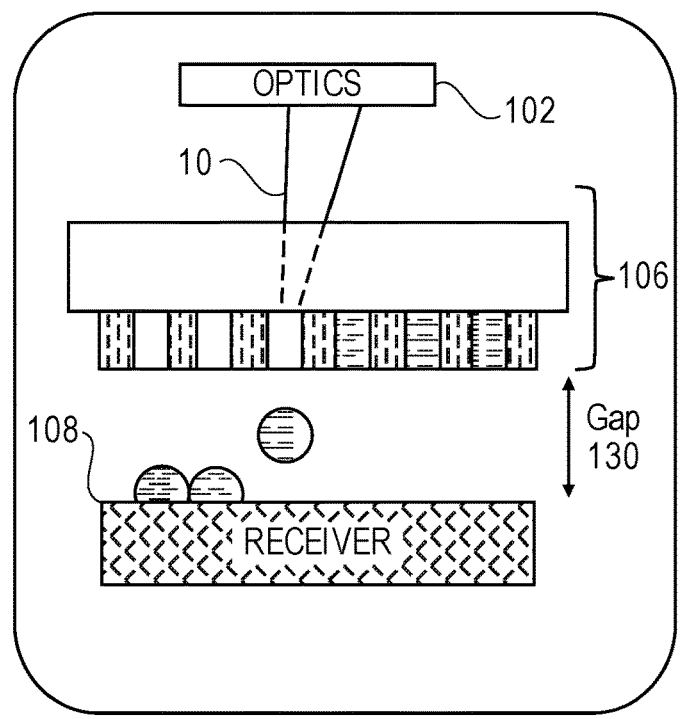
FIGS. 11A and 11B illustrate contrasts in contactless printing arrangements (as shown in FIG. 11A) and contact printing arrangements (as shown in FIG. 11B).
Figure 11B:
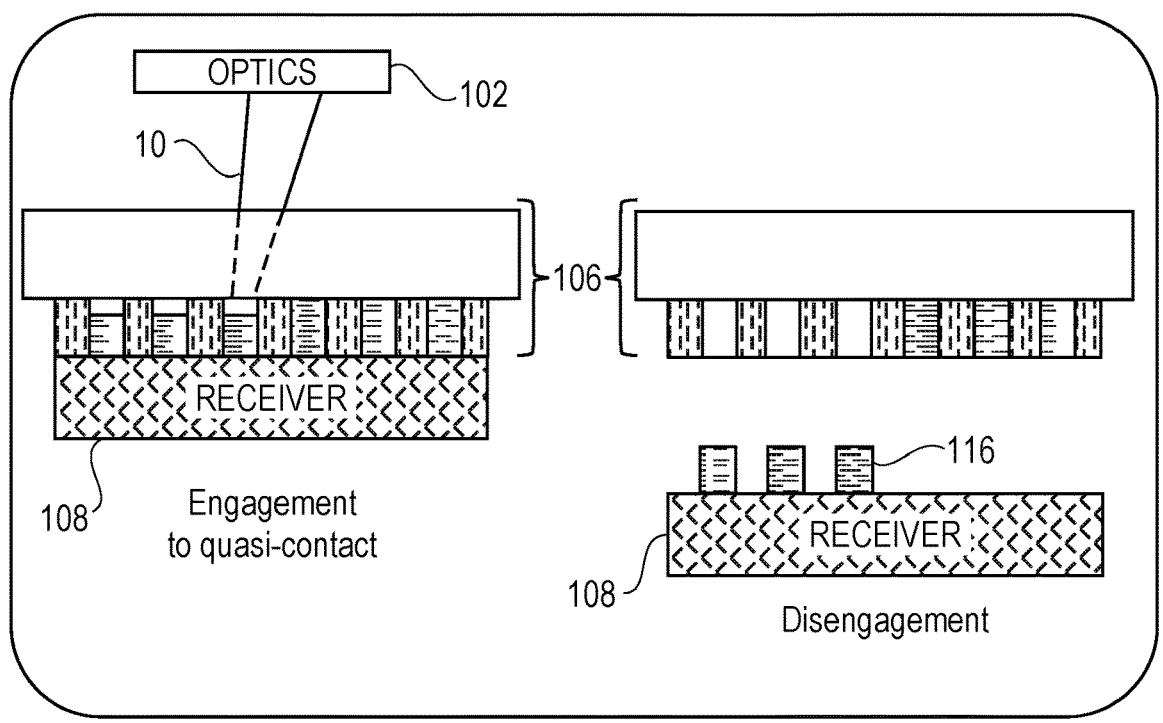

FIGS. 11A and 11B illustrate contrasts in contactless printing arrangements (as shown in FIG. 11A) and contact printing arrangements (as shown in FIG. 11B). In the contactless arrangement, laser beam 10 is focused using optical arrangement 102 onto ink in a donor layer 106 (e.g., made up of a transparent substrate in ink-filled mesh) and ink droplets are jetted across a gap 130 to a receiver substrate 108. Any of the above-described printing arrangements may be used in connection with this non-contact printing embodiment. The contact printing embodiment is illustrated in FIG. 11B. In the left-hand view, the receiver 108 is shown with its upper surface abutting the lower surface of donor layer 106 while the laser beam 10 is scanned over the donor layer 106. When the laser is focused, ink in the screen mesh openings is heated. As the ink cools, when the laser beam is removed, it adheres to the receiver substrate surface so that when the receiver substrate 108 is removed from donor layer 106, a layer 116 of ink is left on the receiver substrate.

The contact printing embodiment may result in undesired ink transfers to the receiver substrate due to the ink adhering to the receiver substrate even when it is not heated, and/or because of heat being conducted to screen mesh openings even though those openings are not desired for ink transfer in a given layer. To avoid such inadvertent or undesired transfers, a negative printing arrangement may be used, as shown in FIGS. 12A-12C. In FIG. 12A, before the receiving substrate is brought into contact with the donor layer 106, the laser beam 10 is scanned so as to jet ink droplets 124 into a reservoir 118. The droplets so jetted are from screen mesh openings that correspond to areas of the screen from which no ink transfer to the receiver substrate is desired. In effect, a negative image of the desired layer is jetted in the form of droplets into reservoir 118. This prevents later contamination of the substrate when it is pressed against the donor layer. Then, as shown in FIG. 12B, the receiver substrate 108 is brought into contact with the donor layer 106, and the laser beam 10 is scanned over the screen mesh openings that contain ink. The ink so heated will be transferred to the receiver substrate, as described above, so that when the receiver substrate 108 is removed from the donor layer 106, as shown in FIG. 12C, all that adheres to the receiver substrate 108 is ink that corresponds to a desired pattern 126.

Figure 13:
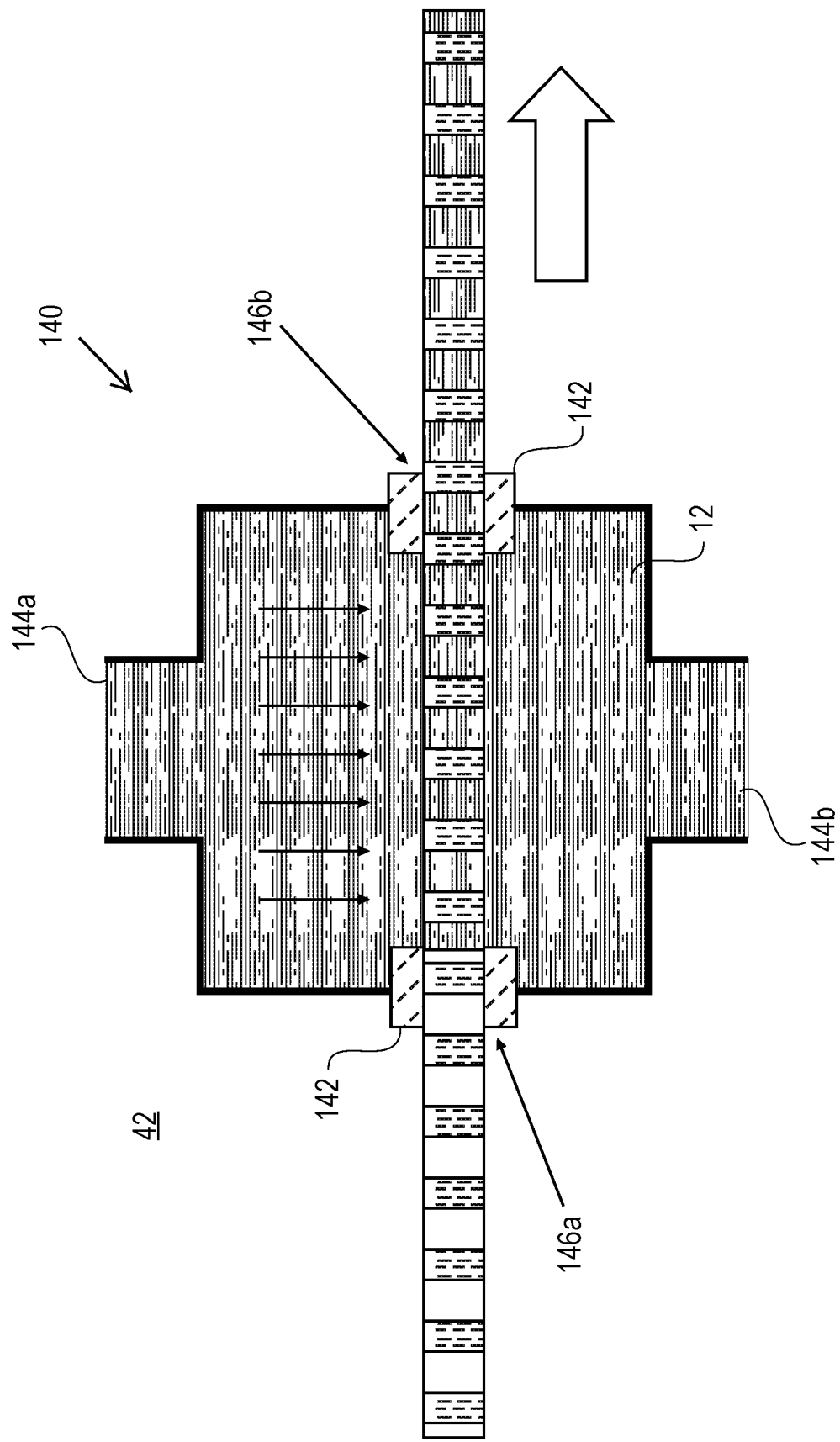
FIG. 13 illustrates an alternative arrangement for coating a screen mesh with ink in accordance with embodiments of the present invention.

Finally, turning to FIG. 13, an alternative arrangement for coating the screen mesh with ink is illustrated. In this example, instead of the roller applicators for the ink application areas 42, an ink applicator 140 is used. The applicator 140 is essentially an ink reservoir that may have ink 12 flowing between an inlet port 144a and an outlet port 144b with the screen 22 passing through the reservoir in a direction orthogonal to the ink flow. As the screen 22 passes through the ink flow, the screen openings 26 are filled with ink. Squeegees 142 placed at screen entrance and exit ports 146a, 146b prevent the leaking of ink 12 from the reservoir and also act to clean the screen of excess ink as it exits.

Thus, methods and apparatus printing, and, in particular, such methods and apparatus as employ lasers to create droplets from donor materials, which droplets, when solidified in the aggregate, form 2D or 3D patterns or structures, have been described.

What is claimed is:

1. A method of laser-based droplet jetting, comprising coating a substantially uniform layer of a viscous ink on a mesh-like transport screen, said ink being retained within spaces of the mesh-like transport screen, conveying the mesh-like transport screen to a working area, and, with the mesh-like transport screen positioned within the working area and supported by a transparent substrate that touches the mesh-like transport screen and absorbs a laser beam, heating the ink within the spaces of the mesh-like transport screen, said heating creating micro-vapor bubbles within the spaces of the mesh-like transport screen, thereby causing ink droplets to be jetted from the spaces of the mesh-like transport screen.

2. The method of claim 1, further comprising forming a structure on a receiving substrate arranged near the working area by jetting the ink droplets (a) in an aggregation, or (b) sequentially, across a gap from the mesh-like transport screen to the receiving substrate and displacing the mesh-like transport screen and the laser beam relative to one another at times between the jetting of the droplets; or by jetting those of the ink droplets that will not contribute to the structure from the mesh-like transport screen and subsequently directly printing remaining ones of the ink droplets onto the receiving substrate while the receiving substrate is in contact with the mesh-like transport screen.

3. The method of claim 1, wherein within the working area, the laser beam is made incident upon areas of the ink disposed within the spaces of the mesh-like transport screen, or the laser beam is made incident upon areas adjacent to the ink disposed within the spaces of the mesh-like transport screen.

4. The method of claim 1, further comprising maintaining the mesh-like transport screen under lateral strain while the heating occurs.

5. The method of claim 1, wherein the substantially uniform layer of viscous ink is coated on the mesh-like transport screen in an ink application area in which the ink is injected into the spaces of the mesh-like transport screen from a top portion of the mesh-like transport screen and excess portions of the ink are removed from a bottom portion of the mesh-like transport screen.

6. The method of claim 5, wherein the excess portions of the ink are removed from the bottom portion of the mesh-like transport screen by a squeegee arrangement located downstream, from a standpoint of translation of the mesh-like transport screen with respect to a position at which the ink is injected into the spaces of the mesh-like transport screen, from the position at which the ink is injected into the spaces of the mesh-like transport screen.

7. The method of claim 1, wherein the substantially uniform layer of viscous ink is coated on the mesh-like transport screen in an ink application area in which the mesh-like transport screen is transported through an ink reservoir and excess ink is removed by a squeegee arrangement located at an exit of the ink reservoir.

8. The method of claim 1, further comprising arranging the transparent substrate on a top surface of the mesh-like transport screen after the spaces of the mesh-like transport screen have been filled with the ink.

9. The method of claim 8, further comprising, prior to arranging the transparent substrate on the top surface of the mesh-like transport screen, coating a bottom surface of the transparent substrate with a heat absorbing layer.

10. The method of claim 8, further comprising, prior to arranging the transparent substrate on the top surface of the mesh-like transport screen, introducing a heat absorbing layer between a bottom surface of the transparent substrate and the mesh-like transport screen.

11. The method of claim 10, wherein the heat absorbing layer is introduced by coating the heat absorbing layer on a top surface of the mesh-like transport screen after the spaces of the mesh-like transport screen have been filled with the ink.

12. The method of claim 1, wherein the heating comprises making the laser beam incident on the transparent substrate in contact with the mesh-like transport screen for a time sufficient to form a droplet of the viscous ink, and continuing to keep the laser beam incident for an additional time required for the droplet to separate from the mesh-like transport screen.

13. The method of claim 1, further comprising monitoring a position of the mesh-like transport screen within the working area using an imaging device prior to operating the laser beam for said heating, and adjusting a relative position of the laser beam with respect to the spaces of the mesh-like transport screen so that the laser beam focuses at or near respective centers of the spaces.

14. The method of claim 1, further comprising repeating the coating, conveying, and heating as needed so as to print an object in accordance with a desired shape.

15. The method of claim 14, wherein a relative position of a printing position at which droplet jetting takes place is adjusted vis-à-vis the object during its fabrication.

* * * * *